(12) United States Patent
Zeier et al.

(10) Patent No.: US 11,391,778 B2
(45) Date of Patent: Jul. 19, 2022

(54) CATEGORY SPECIFIC INDUSTRIAL BATTERY OPTIMIZATION AND RESTORATION DEVICE, WITH BATTERY DIAGNOSTICS, BATTERY LIFE PROGNOSTICATION, AND AN ARTIFICIAL INTELLIGENCE MEANS

(71) Applicant: Bravo Zulu International Ltd., Las Vegas, NV (US)

(72) Inventors: Bruce Eric Zeier, Romoland, CA (US); James Anthony Mettler, Idyllwild, CA (US); Steve M. Hankins, Escondido, CA (US); Anthony D. Araiza, San Jacinto, CA (US); Vincent E. Whitehead, Dallas, TX (US); Phil Sih, Sparks, NV (US)

( * ) Notice: Subject to any disclaimer, the term of this patent is extended or adjusted under 35 U.S.C. 154(b) by 50 days.

(21) Appl. No.: 16/666,828

(22) Filed: Oct. 29, 2019

(65) Prior Publication Data

US 2020/0110135 A1    Apr. 9, 2020

Related U.S. Application Data

(63) Continuation-in-part of application No. PCT/US2019/037206, filed on Jun. 14, 2019.
(Continued)

(51) Int. Cl.
*G01R 31/36* (2020.01)
*G01R 31/364* (2019.01)
*H02J 7/00* (2006.01)

(52) U.S. Cl.
CPC ....... *G01R 31/3648* (2013.01); *G01R 31/364* (2019.01); *G01R 31/3646* (2019.01); *H02J 7/0029* (2013.01)

(58) Field of Classification Search
CPC ............ G01R 31/3648; G01R 31/3646; G01R 31/364; H02J 7/0029; H02J 7/00032; H02J 7/0048; H02J 7/0069; H02J 7/00711; Y02E 60/10; H01M 2010/4278; H01M 10/425; H01M 10/4242; H01M 10/06
(Continued)

(56) References Cited

U.S. PATENT DOCUMENTS

| 4,079,443 A | 3/1978 | Udvardi-Lakos et al. |
| 4,577,164 A * | 3/1986 | Grib .................. H03B 5/30 318/128 |

(Continued)

*Primary Examiner* — M Baye Diao
(74) *Attorney, Agent, or Firm* — Kirk A. Buhler; Buhler & Associates

(57) ABSTRACT

Improvements in a battery optimization and restoration device that uses a means of varying the regulator voltage as a function of time and discharge event timing and depth in order to establish a consistent power level for the charging of the capacitor. The device models the power supply regulation voltage as a first order factor as a function of time. The regulation voltage is modeled as a function of time so as to maintain an acceptable charging current at all times by charging a large capacitive load which is periodically discharged in a rapid pulse-like manner requires a modeled regulation voltage that is synchronized to the discharge frequency of the capacitor. The modeled charging is a function of the discharge depth and the charging height in initial capacitor voltage before the discharge and the final capacitor voltage after the discharge.

18 Claims, 14 Drawing Sheets

Related U.S. Application Data

(60) Provisional application No. 62/686,717, filed on Jun. 19, 2018.

(58) Field of Classification Search
USPC .......................................................... 320/128
See application file for complete search history.

(56) References Cited

U.S. PATENT DOCUMENTS

| | | |
|---|---|---|
| 4,584,514 A | 4/1986 | Kaminski |
| 5,063,341 A | 11/1991 | Gali |
| 5,296,797 A | 3/1994 | Bartlett |
| 5,638,267 A * | 6/1997 | Singhose ............... B25J 9/1635 700/28 |
| 5,648,714 A | 7/1997 | Eryou et al. |
| 5,677,612 A | 10/1997 | Campagnuolo et al. |
| 5,891,590 A | 4/1999 | King |
| 6,072,299 A | 6/2000 | Kurle et al. |
| 6,184,650 B1 | 2/2001 | Gelbman |
| 6,414,465 B1 | 7/2002 | Banks et al. |
| 6,556,019 B2 | 4/2003 | Bertness |
| 6,566,844 B1 | 5/2003 | Schlicht |
| 6,586,850 B1 | 7/2003 | Powers |
| 6,586,913 B2 | 7/2003 | Rolfes |
| 6,822,425 B2 | 11/2004 | Krieger et al. |
| 6,975,071 B2 | 12/2005 | Tsai |
| 7,145,266 B2 | 12/2006 | Lynch et al. |
| 7,786,702 B1 | 8/2010 | Chait et al. |
| 8,330,428 B2 * | 12/2012 | Zeier ................. H01M 10/4242 320/166 |
| 9,166,435 B2 * | 10/2015 | Zeier ................. H01M 10/4242 |
| 9,270,217 B2 * | 2/2016 | Flett ........................ H02P 27/08 |
| 10,599,106 B2 * | 3/2020 | Zeier .................... G05B 13/028 |
| 2004/0056640 A1 | 3/2004 | Valand |
| 2008/0143299 A1 | 6/2008 | Altman |
| 2008/0169819 A1 | 7/2008 | Ishii |
| 2008/0185996 A1 | 8/2008 | Krieger et al. |
| 2008/0247199 A1 | 10/2008 | Djenguerian et al. |
| 2008/0289602 A1 | 11/2008 | Haug et al. |
| 2010/0117604 A1 * | 5/2010 | Zeier .................... H01M 10/06 320/166 |
| 2010/0127666 A1 | 5/2010 | Ball |
| 2011/0163700 A1 | 7/2011 | Masten |
| 2011/0248835 A1 | 10/2011 | Speegle et al. |
| 2019/0176639 A1 * | 6/2019 | Kumar ................. G07C 5/0808 |

* cited by examiner

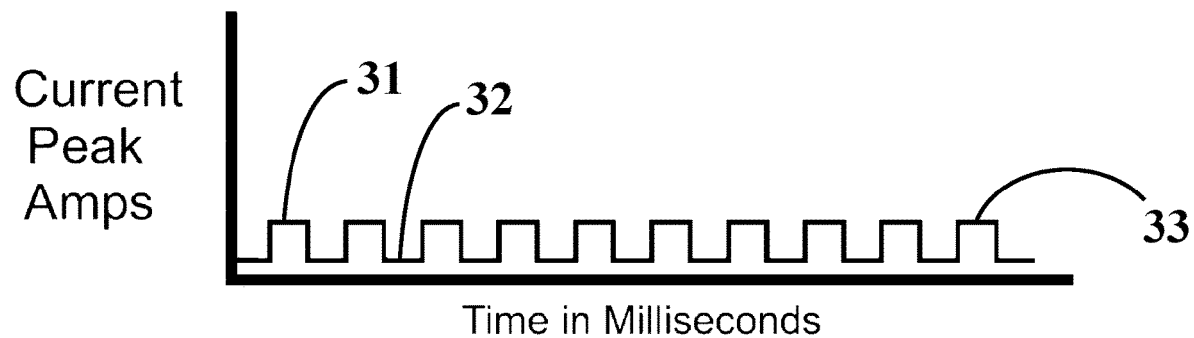
FIG. 6.1
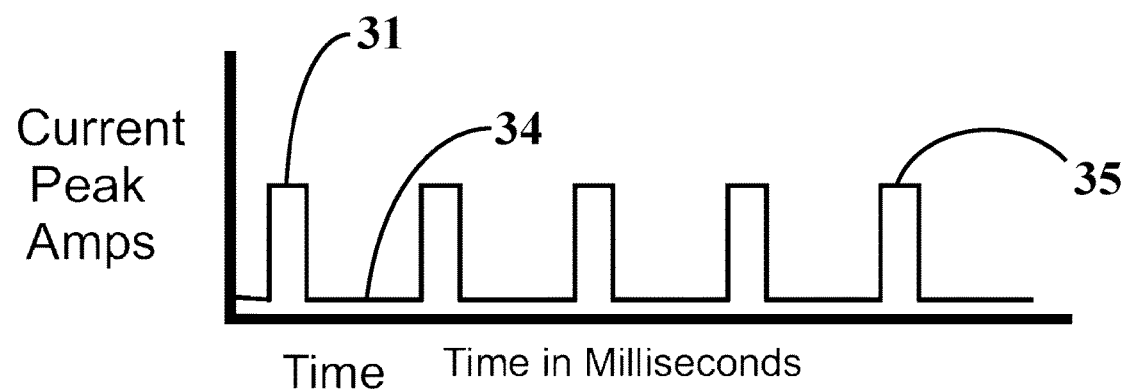
FIG. 6.2
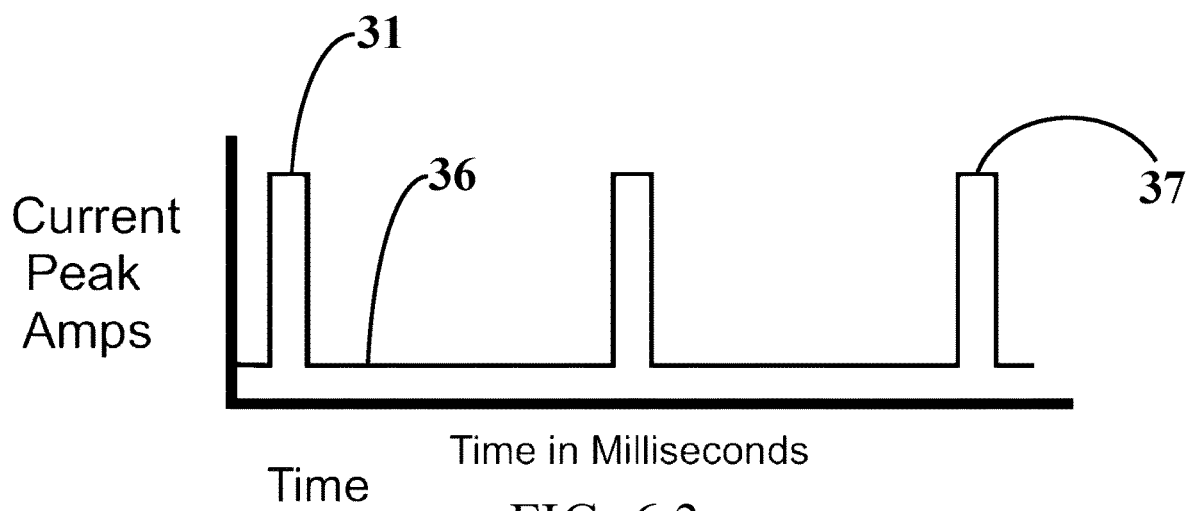
FIG. 6.3

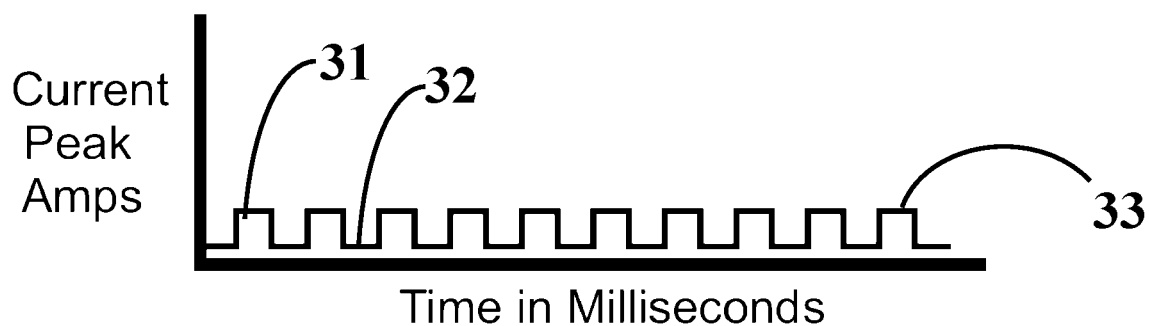
FIG. 7.1
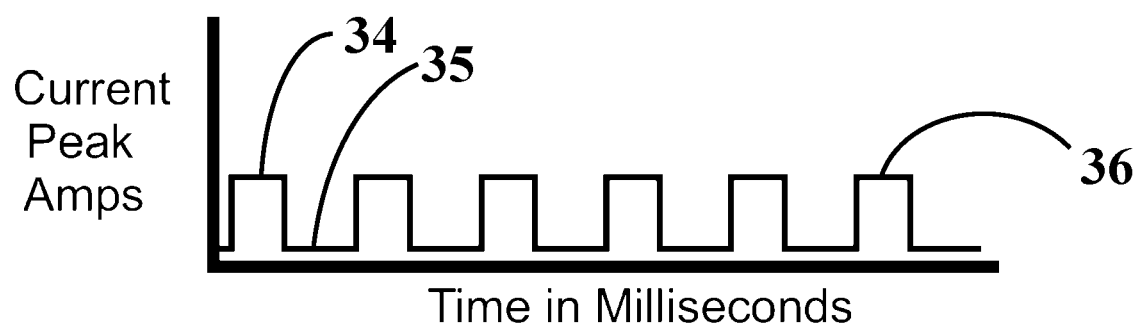
FIG. 7.2
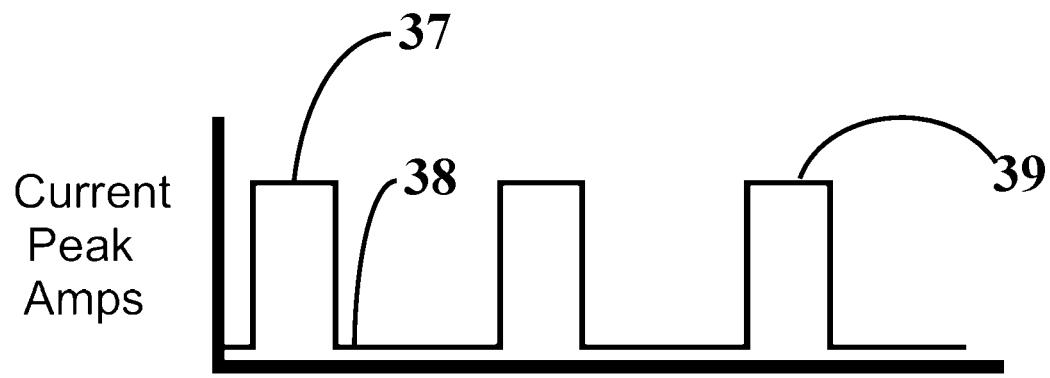
FIG. 7.3

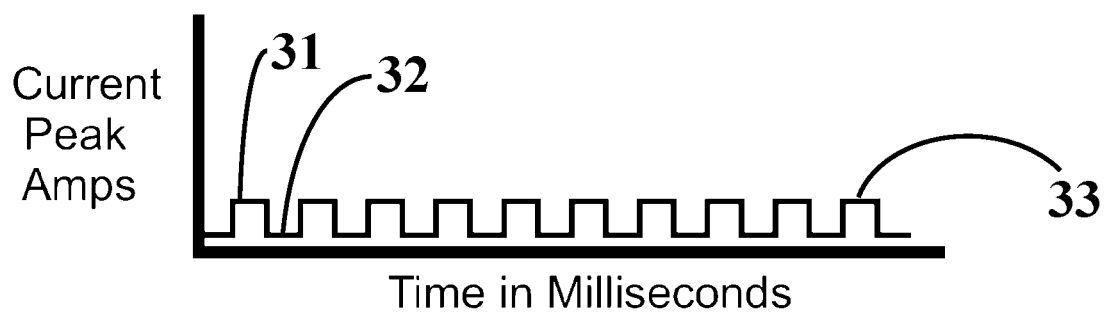
FIG. 8.1
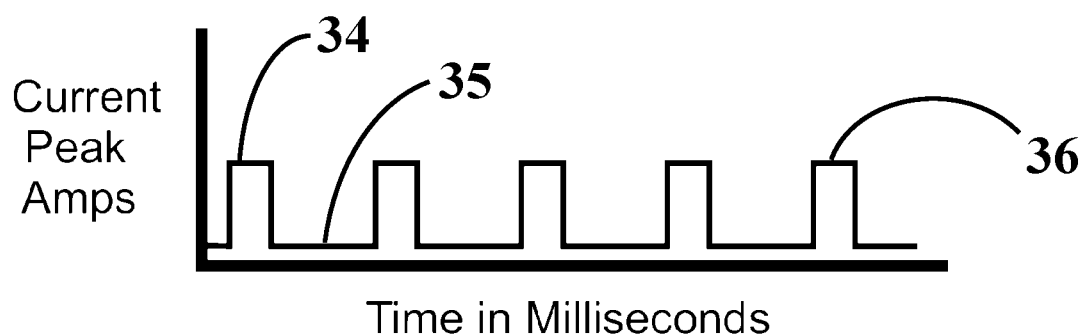
FIG. 8.2
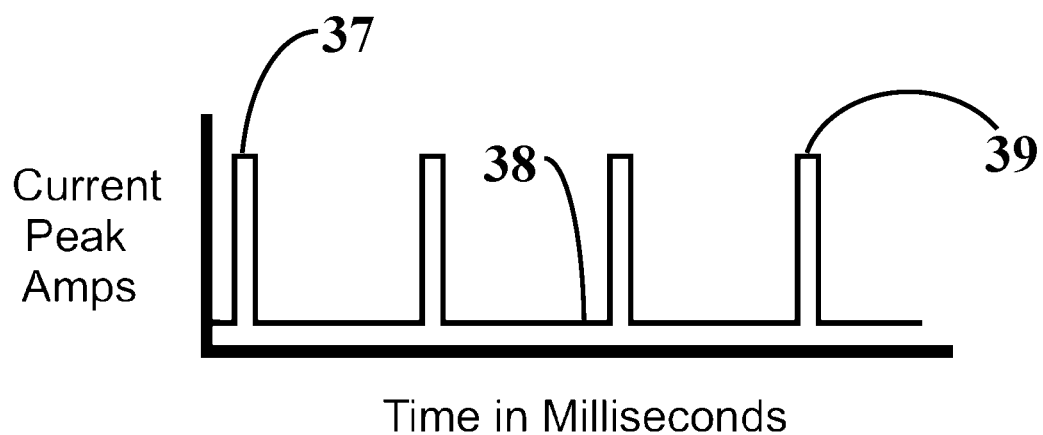
FIG. 8.3

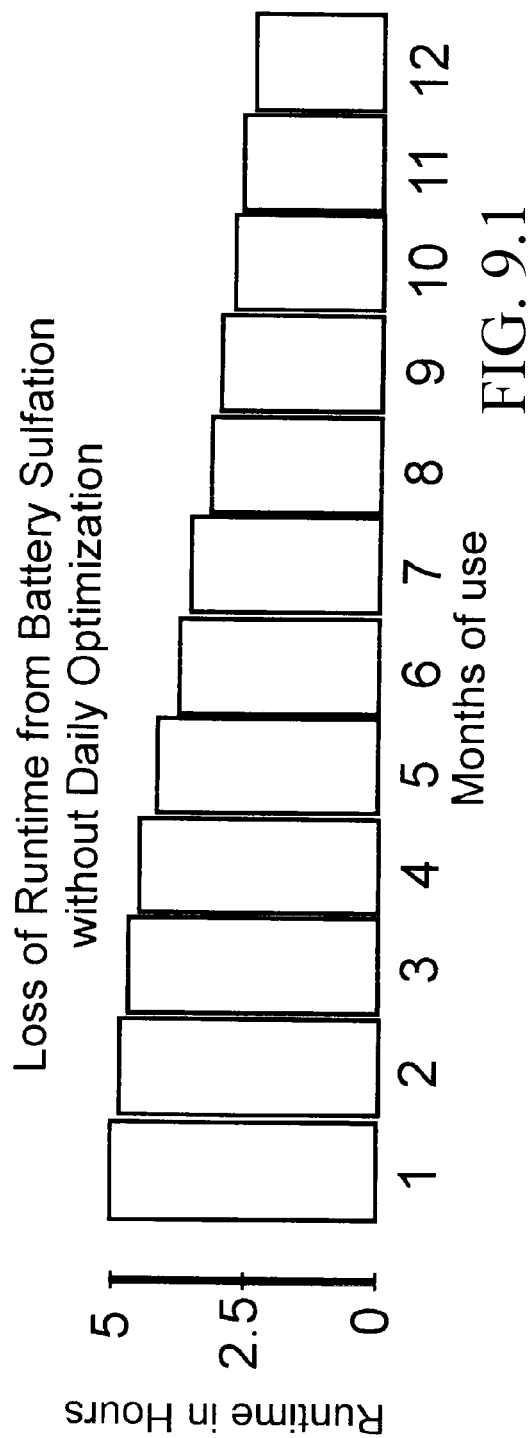
FIG. 9.1
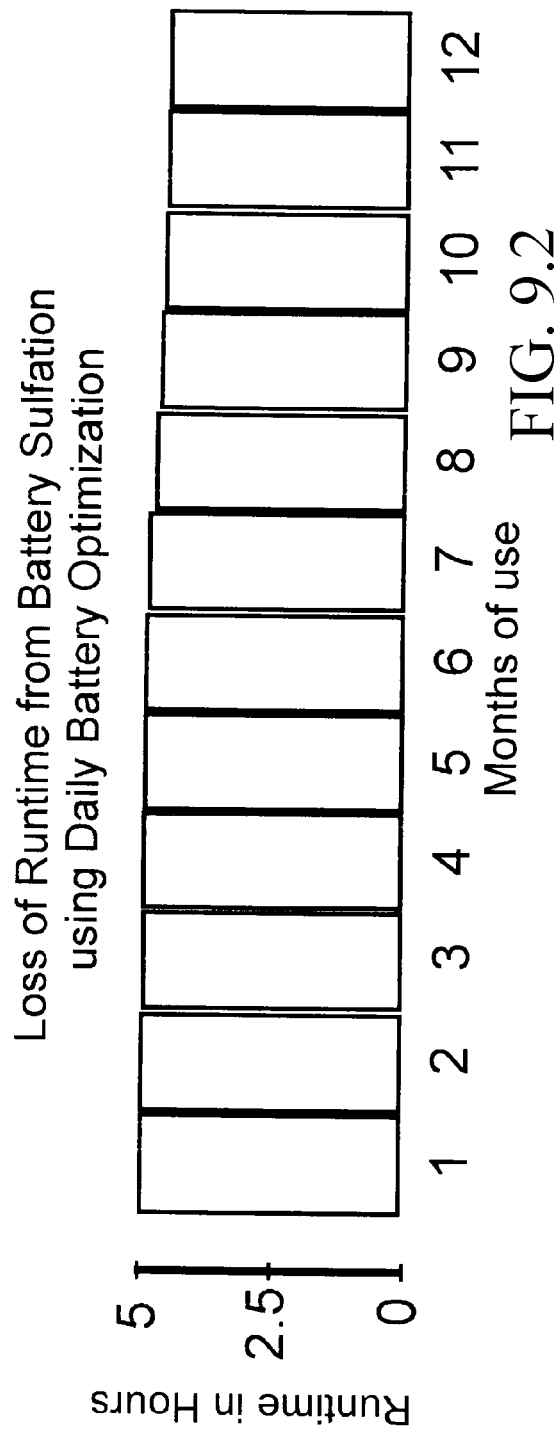
FIG. 9.2

| Charge Cycle | Input Current to Capacitor | Battery Voltage | Battery Peak Amps |
|---|---|---|---|
| 1 | 200 ma | 12.5 V | 0 |
| 2 | 400 ma | 12.5V | 0 |
| 3 | 600 ma | 12.5V | 0 |
| 4 | 800 ma | 12.5V | 0 |
| 5 | 1 amp | 12.6V | 30 |
| 6 | 1.2 amp | 12.7V | 60 |
| 7 | 1.4 amp | 12.8V | 90 |
| 8 | 1.6 amp | 12.9V | 120 |
| 9 | 1.5 amp | 12.85V | 110 |
| 10 | 1.45 amp | 12.825V | 100 |
| 11 | 1.45 amp | 12.825V | 100 |
| 12 | 1.45 amp | 12.825V | 100 |

FIG. 10

| Charge Cycle | Battery/Device Impedance in milli-ohms | Output Current to Battery or Device | Battery or Device Voltage | Battery or Device Peak Amps |
|---|---|---|---|---|
| 1 | 10 | 1.45 amp | 12.8V | 100 |
| 2 | 10 | 1.45 amp | 12.8V | 100 |
| 3 | 9 | 1.45 amp | 12.9V | 110 |
| 4 | 9 | 1.25 amp | 12.85V | 90 |
| 5 | 9 | 1.35 amp | 12.9V | 100 |
| 6 | 9 | 1.35 amp | 12.9V | 100 |
| 7 | 9 | 1.35 amp | 12.9V | 100 |
| 8 | 8 | 1.35amp | 13.0V | 110 |
| 9 | 8 | 1.15 amp | 12.95V | 90 |
| 10 | 8 | 1.25 amp | 13.0V | 100 |
| 11 | 8 | 1.25 amp | 13.0V | 100 |
| 12 | 7 | 1.25 amp | 13.1V | 100 |

FIG. 11

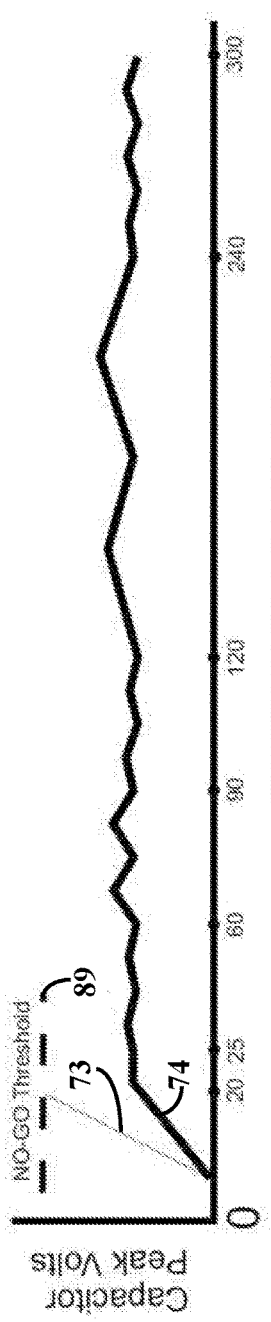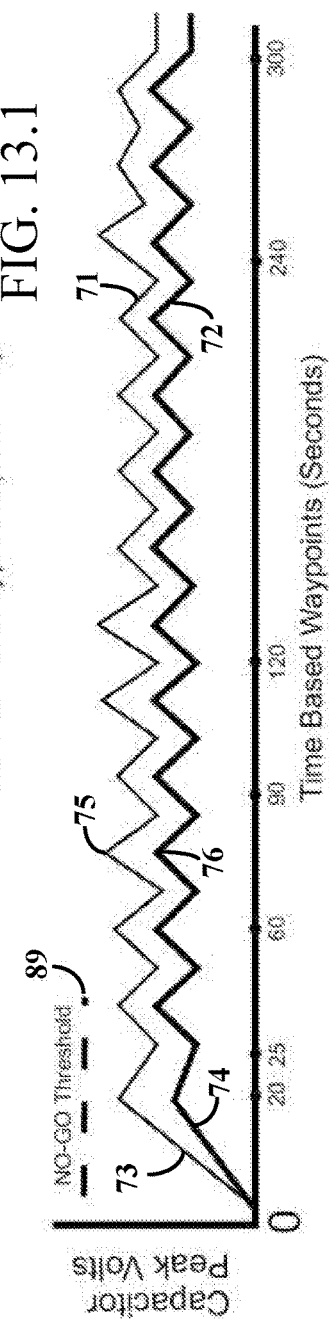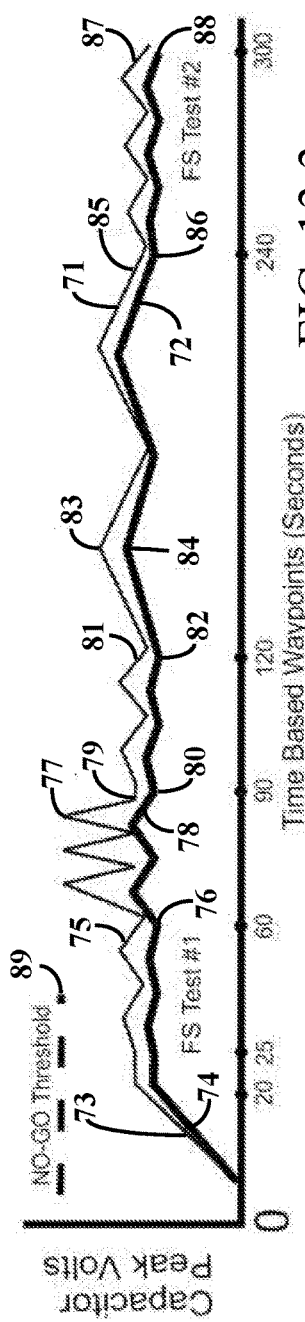
FIG. 13.1
FIG. 13.2
FIG. 13.3

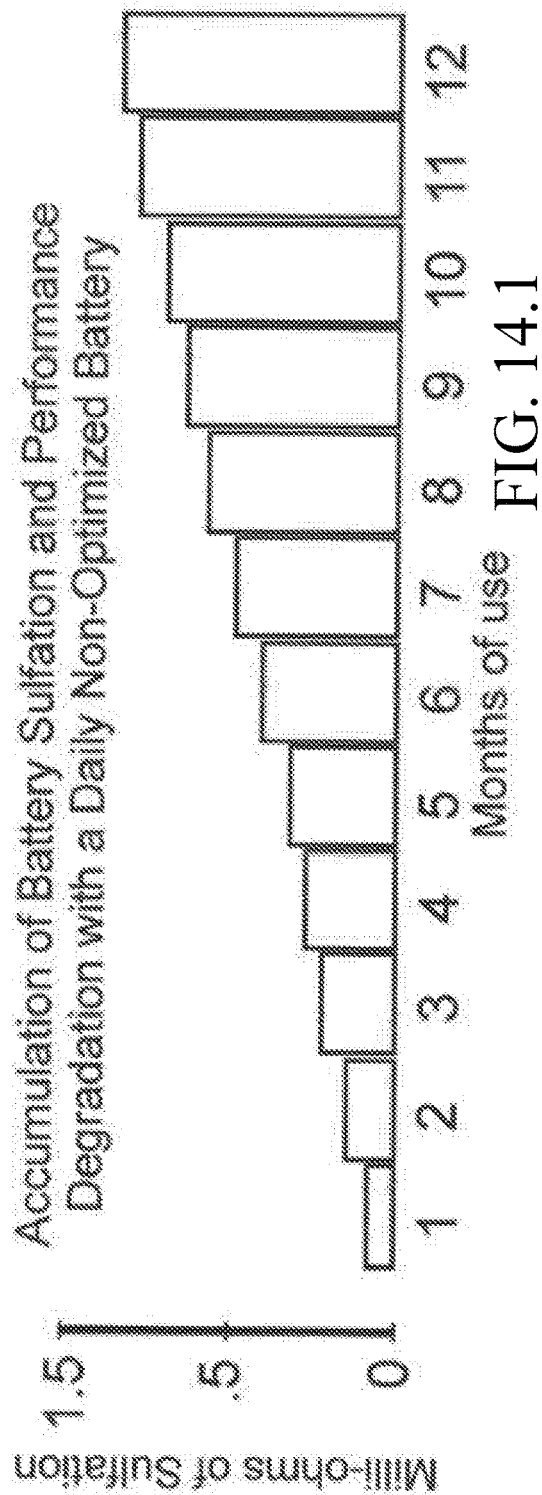
FIG. 14.1
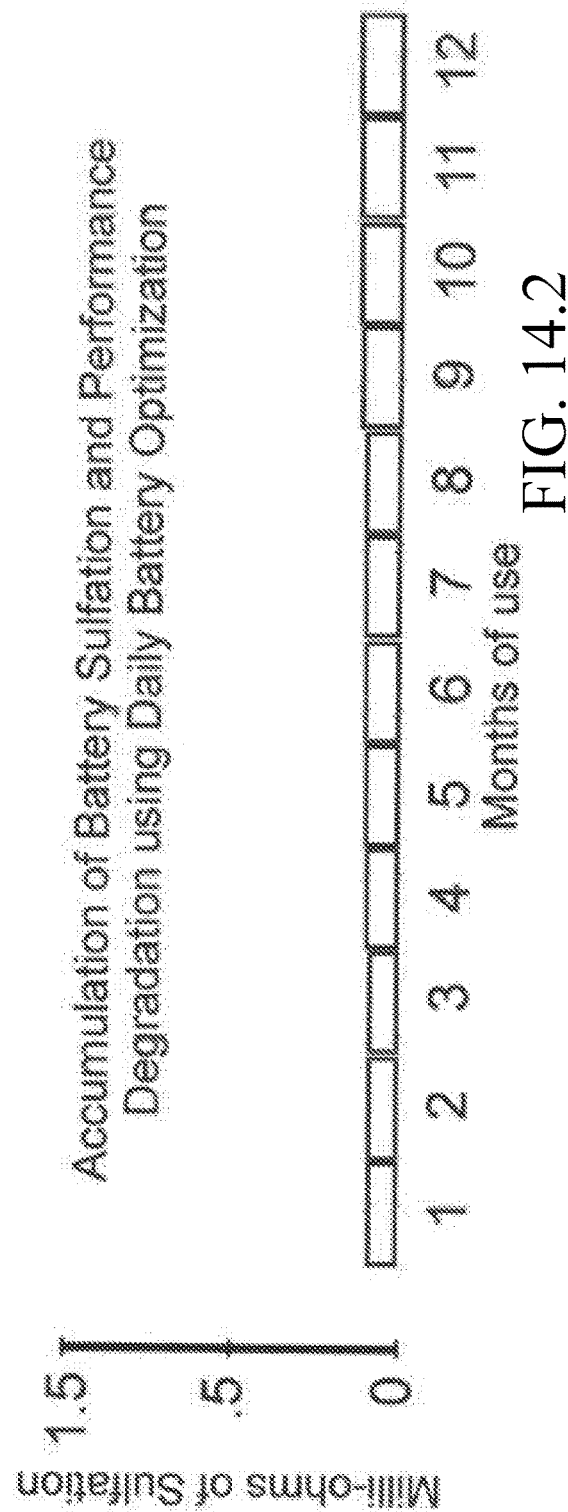
FIG. 14.2

CATEGORY SPECIFIC INDUSTRIAL BATTERY OPTIMIZATION AND RESTORATION DEVICE, WITH BATTERY DIAGNOSTICS, BATTERY LIFE PROGNOSTICATION, AND AN ARTIFICIAL INTELLIGENCE MEANS

CROSS REFERENCE TO RELATED APPLICATION

This application claims the benefit of Provisional Application Ser. No. 62/686,717 filed Jun. 19, 2018 the entire contents of which is hereby expressly incorporated by reference herein.

STATEMENT REGARDING FEDERALLY SPONSORED RESEARCH OR DEVELOPMENT

Not Applicable

THE NAMES OF THE PARTIES TO A JOINT RESEARCH AGREEMENT

Jim Mettler, Steve Hankins, Anthony Araiza

INCORPORATION-BY-REFERENCE OF MATERIAL SUBMITTED ON A COMPACT DISC

Not Applicable

BACKGROUND OF THE INVENTION

Field of the Invention

The invention relates to performance enhancement, performance diagnostics, and battery life remaining prognostication, with an artificial intelligence means, within the field of Lead-Acid batteries.

Description of Related Art Including Information Disclosed Under 37 CFR 1.97 and 1.98

Prior art utilized various methodologies in the creation of a Peak Amplitude using a Pulse Width Modulated Signal, most of which focus on a high frequency-low current output signal. Prior art fails to teach the use of an AC generated, or DC Generated, or Subject Battery DC Generated, or Adjacent Battery DC Generated, or a Solar Panel Array DC or AC Generated, or a regenerative braking or other regenerative circuitry means, or DC Generated Vehicle—Vessel—or other Motive Transportation means power generation source, providing a fixed voltage potential to a stored energy device, which is then discharged into a battery using a PWM signal that is fixed in the "ON State," variable in the "OFF State," correspondingly altering the output frequency of the pulse creating the optimum range of pulse amplitude for Category Specific batteries in a variable high current manner.

Prior art fails to teach the use of an AC generated, or DC Generated, or Subject Battery DC Generated, or Adjacent Battery DC Generated, or a Solar Panel Array DC or AC Generated, or a regenerative braking or other regenerative circuitry means, or DC Generated Vehicle—Vessel—or other Motive Transportation means power generation source, providing a fixed voltage potential to a stored energy device, which is then discharged into a battery using a PWM signal that is variable in the "ON State," variable in the "OFF State," correspondingly altering the output frequency of the pulse creating the optimum range of pulse amplitude for Category Specific batteries in a high current variable manner.

Prior art does not teach that an optimum output relationship between ON an OFF-State timing occurs for any battery condition, within any operating environment, at an applied source voltage potential, that when applied to a battery may result in an optimum Peak Amplitude proportional to the battery's internal conductive condition. That internal condition is unique to each battery within the category, a result of sulfation or other internal factors, therefore it is understood that non-sulfation related internal factors within the battery contributing to performance loss are unaffected by the process.

What is needed is a system that uses performance diagnostics, and battery life remaining prognostication, with an artificial intelligence means, within the field of Lead-Acid batteries. The category Specific Industrial Battery Optimization and Restoration Device, with Battery Diagnostics, Battery Life Prognostication, and an Artificial Intelligence Means disclosed in this document provides the solution.

BRIEF SUMMARY OF THE INVENTION

The Category Specific Device consists of analogue electronic circuitry, or a digital electronic circuitry with a computer processor and software means, that generates, applies, measures and controls the Pulse Width Modulated signals applied along an electrically conductive pathway connected to a subject battery, in a repeating manner, creating a variable output frequency, variable Peak Amplitude pulse signal within the subject battery.

The PWM signal Peak Amplitude is controlled in a manner, increasing or decreasing in real time, creating a signal amplitude of a frequency and peak current providing a desirous frequency and amplitude to the battery, corresponding to a pre-determined target value considering the effect of the battery's internal resistance, which maximizes the ionic affect upon the sulfate molecule.

This ionization process applied to the sulfate molecule $PbSO_4$, causes the sulfate radical $SO_4$ to ionically separate and repel from the lead plate, which then re-ionizes with water re-forming a sulfuric acid electrolyte.

The Category Specific Device may be controlled manually by a human operator, automatically by an analogue circuitry, automatically by a computer processor, hardware and software, or an Artificial Intelligence Means.

The Category Specific Device may act as a standalone device, or in conjunction with external devices such as a battery charger. When operating in conjunction with an external charger, the device may act as a Battery Optimization SCAN, Command and Control process, controlling those external devices and automatically alternating between a battery desulfation mode, and a charging mode, controlling the charger to battery connection means using an internal connection means within the device. The alternating connection means both charges and desulfates the battery in one applied process.

The Category Specific Device may collect and process device measured battery metrics, formulating a Battery Peak Voltage Metric, which is used to calculate a Battery Health Indication metric, which is used to further calculate a Battery Life Remaining Prognostication, displaying that result on the device instrumentation or a cloud-based methodology.

The Category Specific Device may use a bi-directional communication means to transmit battery or device-based metrics to a remotely based server.

The Power Supply Means is the selectable source and corresponding manner in which power is distributed from the power source to the PWM Module. The selections include, but are not limited to: 1) a conventional AC Grid power source typically consisting of a 50 of 60 hz sine wave signal, 2) a DC power available from the subject battery to be desulfated, 3) an adjacent battery to the subject battery to be desulfated, 4) a solar panel array providing a DC signal, 5) a solar panel array with an inverted, AC sine wave power signal, 6) a vehicle, vessel, or other motive transportation means that provides a DC regulated current to recharge a starting or motive operational battery, and 6) an AC or DC output gas combustion generation system.

Variants of the device and processes relate to a narrow scope of battery sizes and types, commercially considered within a Specific Category such as: Amp-Hour Rated Capacity, Voltage, Physical Size, Group Rating, Battery Application, Battery Operating Environment, or any other classification means. Specifically applying an electronically generated, human operator, computer, or Artificial Intelligence means controlled, Pulse Width Modulated signal, to a Category Specific member battery to apply a Battery Desulfation or Optimization Process, utilizing that process to conduct a battery performance diagnostic and a battery life remaining prognosis.

The invention also provides for the Category Specific utilization of one or more correspondingly specific, device power generation or conditioning means, which provide a power source for an energy storage means, the output of the storage means is a Pulse width Modulated-Variable Peak Amplitude output of the Category Specific Device to the battery. The Category Specific power generation or conditioning means may include a "Battery Self-Generated" power provisional means, an "Adjacent Battery Generated" power provisional means, a "Solar Panel Array Energy Generated" power provisional means, an "AC Grid Generated" power provisional means, a "Combustion Engine Generated" power provisional means, or a Vehicle—Vessel—or Motive Transportation means, or any combination thereof.

The process is comprised of a "Category Device" with an integral electronic pulse generation output means, which applies this pulse output means to a lead-acid battery within the Specific Category of Lead-Acid Batteries intended for said Category Device to operate upon. Those means are intended to be specific to a homogenous category or grouping of batteries, with like kind operational, design, manufacturing, performance and application characteristics. The "Category Process" intends to minimize the internal impedance of the battery caused by excess daily or periodic sulfation, either in a "Stand-Alone" Category Device configuration, or as a Category Device that operates in conjunction with, and provides a controlling means of, an integral or external device such as a battery charger, or battery discharge tester.

The present disclosure contemplates that some lead acid batteries within their respective Category, may be constructed using individual cells connected by an external bus bar to form the nominal voltage desired from the battery. Individual cells may provide about two volts each; thus, a 12-volt motive battery may include 6 cells in series, a 24-volt battery may include twelve cells, and so on.

The PWM Signal

The present disclosure provides for the use of a Pulse Width Modulated signal, electronically applied to a lead-acid battery with variable Peak Amplitude output, which acts upon the chemical molecule $PbSO_4$, (Lead Sulfate), found within the plate structure of lead-acid battery. This action re-ionizes the $SO_4$ (Sulfate) radical, which causes that molecule to ionically repel from the lead plate, in a commercially viable manner, that desulfates the plates to restore lost performance of the battery.

The present disclosure contemplates that the application of the Category Specific Device's Optimization and Restoration Means to a battery may provide a Battery Health Indication Diagnostic (the BHI Metric), use that diagnostic metric as a conditional means to determine of the battery is worthy of a continued optimization or restoration attempt, thereby considered a "Go or NO-GO" means to allow conditional operational status of the device, and upon a conditional "Go Status" allowing continued device operation, and thereafter, during the continued applied process providing a BHI Delta Representation on a graphical display illustrating the degree of battery performance change, if any.

The present disclosure contemplates after the successful completion of an applied process, using the BHI diagnostic metric in a Battery Life Remaining Prognostication Algorithm, may result in a prediction within a statistical probability, of the Battery Life Remaining of the subject battery.

The present disclosure contemplates that the device and process may be manually controlled by a human operator, automatically by a computer hardware and software means, or automatically by a "Self-Learning" Artificial Intelligence means adapted computer hardware and software system.

The present disclosure contemplates that there is an optimum range of the applied Peak Amplitude, for any Category Specific battery, within a variety of operating environments and applications. The application of the optimum Peak Amplitude, within an optimum output frequency range, provides the fastest possible re-ionization process as measured in time, and the maximum performance restoration with respect to the molecular re-ionization measured in either the improvement of conductance, or the decrease in impedance of the battery.

The present disclosure contemplates that an analogue or digital electronic device or a computer-based hardware and software means may be used to develop a Voltage Peak Detector. A Voltage Peak Detector may be used to create a Peak Voltage battery metric, used as a means to measure the amplitude of applied PWM signals to a battery.

The present disclosure may also provide for the Category Specific, variance of the Pulse Width Modulated (PWM) Output Frequency, resulting in a variable and controllable Peak Amplitude applied to the battery from a fixed or variable voltage output power supply source. The variable may be either the variance of the ON State of the PWM signal, or the OFF State of the PWM signal, or a variance of both ON and OFF states in combination, in a fixed algorithm for a Category Specific battery. The variable may be either the variance of the ON State of the PWM signal, or the OFF State of the PWM signal, or a variance of both ON and OFF states in combination, in a real time algorithm for a Category Specific battery.

The Device Operation

The present disclosure is directed to a battery desulfation and optimization Category Device and Process that may act in a "stand-alone" capacity, directly connected to the battery of a Category Specific Size for which the device was intended, applying only a Battery De-sulfation Process to the battery.

The present disclosure is directed to a battery desulfation and optimization device and process that may act in conjunction with, and control the electrical connection of, ancillary integral or external devices to the battery such as a battery charger or discharger, in a single point connection means.

Prior art does not allow for the Category Specific, real-time measurement of battery or cell metrics and the resultant external, non-battery charger native, independent control of the charger to battery conductive means, based upon the analysis of those battery or battery cell metrics, automatically and periodically interrupting the conductive means to apply a device internally generated, or external battery de-sulfation process before, during or after the battery charging process (optimization), or automatically and periodically applying a modification to the duration of the charger's application of charging current, referred to as the modification and control of the battery's Charge Return Factor, or automatically and periodically interrupting the said conductive means to eliminate, or modify the duration of, the charger's application of a periodic Equalization Charge current, or the control or modification of the charger's native charging profile.

Prior art does not allow that Category Specific, real time or historical battery or battery cell metrics may be used independently, or in combination with other battery or battery cell metrics, or other data means, for real time qualitative analysis of the battery or battery cells.

Prior art does not contemplate that the daily or other periodic application of automated High Peak Amplitude, low frequency current, sulfation elimination processes upon Category Specific batteries, may reduce or eliminate the buildup of performance reducing "daily" sulfation. That reduction of daily sulfation may reduce or eliminate the formation of "crystalline" sulfation, which therefore, may reduce or eliminate the conventional battery sulfation elimination service requirements, allowing the battery to use less electricity per charge, to use significantly more of the intended charger/discharge life cycles referred to as "Cycle Extension or Preservation," and reduce or eliminate the "Equalization Charge" process.

Prior art does not contemplate the ability of the Category Specific Device to utilize the subject battery's own lower than nominal power capacity and voltage, to generate a higher than nominal voltage output, at a high current flow, to affect a lowering of internal sulfation within the battery thereby restoring the subject battery's performance.

Prior art does not contemplate the ability of the Category Specific Device to utilize a vehicle—vessel—or other motive transportation means battery charging nominal voltage output, to generate a higher than nominal voltage output, at a high current flow, to affect a lowering of internal sulfation within the battery restoring lost battery performance.

Prior art does not contemplate the ability of the Category Specific Device to utilize a vehicle—vessel—or other motive transportation means regenerative braking, or other regenerative circuitry means, to generate a higher than nominal voltage output, at a high current flow, to affect a lowering of internal sulfation within the battery restoring lost battery performance.

Prior art does not contemplate the ability of the Category Specific Device to utilize an Industrial Application or Facility regenerative braking, or other regenerative circuitry means, to generate a higher than nominal voltage output, at a high current flow, to affect a lowering of internal sulfation within the battery restoring lost battery performance.

Prior art does not contemplate a provision for the Category Specific Device external control of the battery charger to battery connection means, interrupting that connection means using an external measuring, computational and processing device to control the charger's output to the battery, regardless of the charger's native charge profile requirements; that may in whole or in part based upon battery optimization processes, and in whole or in part by the Category Specific battery or battery cell scientific metrics gathered and processed by internal or external means.

Prior art does not contemplate that the Category Specific Battery Optimization Control Device may use an analogue electronic processing means, or an integral processor, memory, computer software algorithms and hardware combinations, to apply specific calibration adjustments, schedules and data tables modifying the raw battery metric data input of the device sensors, transducers and probes; utilizing those calibrated data measurements to automatically control the battery optimization process using integral or external de-sulfation electronic de-sulfation devices, or integral or external non-electronic de-sulfation means such as the injection of chemical additives into the battery cells.

Prior art does not contemplate that the Category Specific Battery Optimization control device(s), processes, or process algorithm(s), may be integrated within or become a modification of, the native construction of the battery charger circuitry and or the charger's operational profile. The integration may provide the synergistic benefit of sharing common physical attributes of the device's construction, lowering the cost of the device's construction, improving the performance of batteries being charged by the charger, reducing the electrical costs of the charging process, providing the means to reduce the electrical cost of the battery's operation when using the battery charger, increasing the charger's native efficiency, modifying the charger's native operational profile, may allow the charger to import, process and utilize battery or battery cell metric data, may provide the charger a capability to command and control external devices, and provide the means for real time battery optimization and quantification of the battery's performance.

The Qualitative Analysis

The present disclosure may also provide for the Category Specific, real time qualitative rating (scoring) of the battery's optimization or performance restoration status by automatically and quantifiably determining that status using real time data obtained and processed by a computer hardware and software system, then compared in an "Absolute Means" to: 1) the Category Specific battery data of previous desulfation, charging or battery optimization process cycles, or 2) to a Category Specific historical battery database of other like kind batteries undergoing the same desulfating, charging, or optimization processes.

The present disclosure may also provide for the Category Specific, real time qualitative rating (scoring) of the battery's optimization or performance restoration status by automatically and quantifiably determining that status using real time data obtained and processed by a computer hardware and software system, then compared in a "Relative Means" using only the measured performance of the battery under an applied series of qualitative tests, enabled by an Artificial Intelligence means that self learns the battery condition and adjusts the electronic signal output algorithm in real time, to maximize the battery's performance.

The present disclosure may also provide for the, Category Specific, real time control of the battery desulfating, charging, or optimization processes based upon an initial qualitative value, or a quantification of the delta between the initial and subsequent qualitative values, or a Normalization of the Dataset during the continuous real time Battery Health Indication Process qualitative scoring, an Artificial Intelligence self-learning means, or any combination thereof, when comparing the subject battery's Battery Health Indication Process qualitative scoring metrics to the battery's Category Specific Standardization Values Metrics, or the comparisons within the Artificial Intelligence means.

The present disclosure contemplates that many devices do not have an automatic, Category Specific, real time method for measuring, evaluating or quantifying the impedance of a battery or battery cells metric(s), and controlling said de-sulfation means based in whole or in part upon that measured impedance(s). The present disclosure may provide the Category Specific, external measured impedance scan, command and control means to those devices.

The present disclosure contemplates that many devices do not have an automatic, Category Specific real time method for measuring, evaluating or quantifying the volts per cell of the battery cells metric, and controlling said de-sulfation means based in whole or in part upon that measured volts per cell. The present disclosure may provide the Category Specific, external measured volts per cell scan, command and control means to those devices.

The present disclosure contemplates that many devices do not have an automatic, Category Specific, real time method for measuring, evaluating or quantifying the battery voltage metric, and controlling said de-sulfation means based in whole or in part upon that measured battery voltage. The present disclosure may provide the Category Specific, external measured battery voltage scan, command and control means to those devices.

The present disclosure contemplates that many devices do not have an automatic, Category Specific, real time method for measuring, evaluating or quantifying the Category Specific Device's Energy Storage Means Device, typically a capacitor, a resultant Capacitor State of Charge Voltage Metric, and controlling said de-sulfation, Charging or Battery Optimization processes based in whole or in part upon that measured capacitor metric. The present disclosure may provide the Category Specific, capacitor measured voltage scan, command and control means to those devices.

The present disclosure contemplates that many devices do not have an automatic, Category Specific, real time method for measuring, evaluating, quantifying or controlling the Charge Return Factor applied by the charger to the battery, and the means to control the battery charger's Charge Return Factor based in whole or in part upon the measurement of battery or battery cell metrics. The present disclosure may provide the external Category Specific, Charge Return Factor scan, command and control means to those devices.

The present disclosure contemplates that the application of a power generated target high peak amplitude, variable low frequency PWM current to a lead-acid battery may provide a means to determine a "Battery Health Indication Method (BHI). BHI is the measurement of the Storage Means (Capacitor) voltage required to create a target Peak Amperage when the capacitor energy is discharged into the battery, which is then compared to the battery terminal voltage when the battery is in an Open-Circuit, or Resting, or OFF State condition with respect to the applied PWM signal. A time-based sampling of the datapoints created is a BHI Spectrum Analysis, when the Spectrum Analysis time sampling of the "OFF State" frequency adjusted, or the "ON State" frequency is adjusted, or any combination therein, the dataset is thereafter referred to as a BHI Spectroscopy.

Prior art describes the use of an apparatus to predict the remaining capacity of a battery based on an open-circuit voltage of the battery when compared to impedance-based charging or discharging diagnostics. US 2008/0180062 A1. Okumura teaches that the open circuit voltage of the battery may be measured, apply a full discharge current, calculate the acquired discharge rate compared to the battery's intended full discharge rate for a fixed time interval, then calculate the ratio of the rated vs., the acquired discharge rate. The resultant ratio is the current discharge based, battery life remaining prediction. Okumura also teaches that the open circuit voltage of the battery may be compared to a data table of previously conducted tests, this table represents the corresponding ratio between open voltages and current capacities.

The present disclosure contemplates that a Battery Life Remaining Prognostication Protocol, may include diagnostic processes that include; 1) a Battery Health Indication Spectrum Analysis, 2) a Battery Health Indication initialization GO or NO-GO analysis, 3) a Battery Health Indication Rate of Change Spectrum Analysis, 4) a Battery Health Indication Frequency modulated Spectroscopy, 5) a temperature compensated metric factor, or 5) any combination thereof.

The present disclosure contemplates that a Battery Life Remaining Spectrum Analysis, is the application of a software algorithm that plots BHI indication sample points of the battery undergoing a PWM desulfation process at a target High Peak Amplitude, low frequency current, to a fixed sampling of time interval waypoints resulting in a BHI dataset curve with repeating samples that may number in the thousands, creating a high resolution graphical comparison means for comparison to a like kind, category specific battery life remaining data table. The subject battery's measured BHI Spectrum Analysis curve is then compared to the data table of like a kind battery master spectrum analysis using the same applied PWM Peak Amplitude as a standard, resulting in a specific data setpoint ratio between the curves at comparative time waypoints, which is then used to create a "weighted mean average" of those comparative data setpoints, resulting in a ratio multiplier than may be used to determine the battery life remaining of the subject battery. The greater the delta between the subject and the master, the lower the remaining life expectancy of the subject. The lesser the delta, the greater the life remaining expectancy. This BHI Spectrum Analysis metric may be used in whole or in part, to determine a Battery Life Remaining metric.

The present disclosure contemplates that the initial BHI Indication Initialization Go or NO-GO metric may be used in whole or in part, to determine the Battery Life remaining of the battery. This metric results from the measuring of the PWM storage means capacitor voltage that is required to create the desirous Peak Amplitude within the battery, at an initialization process fixed time after the process has stabilized during a ramp up process. The battery's internal resistance in reference to Ohm's law, would therefore dictate the required capacitor voltage to reach a predetermined Peak Amperage within the battery using the applied PWM output signal. This GO or NO-GO capacitor voltage metric sampled at an initial fixed time, such as 20 seconds into the applied process, would be compared to a known master battery data table. A capacitor value below the target value would allow continued process application to the battery, while a target value above the battery master standard would indicate excessively high resistance within the battery and prompt a NO-GO value interrupting the process application to the battery. The BHI GO, or NO-GO metric may also be used for Battery Life Remaining Prognostication.

The present disclosure contemplates that a BHI Rate of Change metric may be created that may be used in Battery Life Remaining Prognostication. Once the capacitor voltage 'measured GO indication is determined within the initial fixed time reference point, followed by an additional capacitor voltage measurement at a specific time beyond the initial GO sample, may provide a delta comparison between those values. Comparing the subject battery and a master battery delta comparative values creates a ratio which may be used as a means in whole or in part, to determine the battery life remaining expectancy of the battery. The rate at which the capacitor voltage is reduced between the constant fixed time intervals, during the application of the constant peak amplitude to the battery, indicates a rate of reduction in sulfation induced resistance. It is known that batteries that reduce their sulfation induced resistance at a faster rate, with the same applied current, within a fixed time period, all other factors remaining constant, have a longer life expectancy than batteries that have a slower rate of sulfation induced resistance. Therefore, the greater the capacitor value delta between the subject battery compared to the master battery database, the lower the life expectancy of the battery. The lesser the capacitor value delta between the subject battery compared to the master battery database, the greater the life expectancy of the battery.

The present disclosure contemplates that a Frequency Adjusted Pulse Width Modulated high current signal may provide a Battery Health Indication Spectroscopy metric that may be used to predict the battery life remaining of a subject battery when compared to a master battery. A Battery Health Indication Spectrum Analysis with variable and symmetrically applied frequencies in a linear, nonlinear, or asymmetrical pulse grouping may result in a Battery Health Indication Spectroscopy metric. The variability may be applied to the PWM "ON State," the "OFF State," or any combination thereof. This subject battery BHI Spectroscopy may be compared to a Master Battery Spectroscopy, compensated for ambient temperature during the analysis, resulting in a Battery Life Remaining Prognostication.

The present disclosure contemplates that a Frequency Adjusted Pulse Width Modulated high current signal compensated for battery or environmental temperatures, may provide a Battery Health Indication Spectroscopy metric that may be used to predict the battery life remaining of a subject battery when compared to a master battery. A Battery Health Indication Spectrum Analysis with variable and symmetrically applied frequencies in a linear, nonlinear, or asymmetrical pulse grouping may result in a Battery Health Indication Spectroscopy metric. This subject battery BHI Spectroscopy may be compared to a Master Battery Spectroscopy resulting in a Battery Life Remaining Prognostication.

The present disclosure contemplates that the Prognostication Protocol software algorithm may consist of an Artificial Intelligence Generated, Normalization of the Battery Health Indicator Spectrum Analysis dataset curve when that "normalization" consists of a mathematical Battery Health Indication Rate of Change Spectrum Analysis factor, or a mathematical Battery Health Indication Frequency modulated Spectroscopy factor, or a mathematical Battery Initial GO, NO-GO analysis factor, or a Capacitor State of Charge metric factor, or a mathematical temperature compensated metric factor, or any combination thereof, therefore not relying upon a master database comparison considered an absolute means of dataset comparison, but rather, only upon the specific battery's real time performance considered a relative comparison means.

The present disclosure contemplates that the Prognostication Protocol software algorithm may consist of a fixed firmware embedded comparison process between Category Specific Battery and Device collected real time metrics, and a known internal device firmware embedded database of Category Specific Batteries, using internal firmware embedded algorithms to provide a comparison and indication to the human operator of the future service life expectation of the battery, or commonly referred to as a Battery Life Remaining indication.

The present disclosure contemplates that the Prognostication Protocol software algorithm may consist of a fixed firmware embedded comparison process between Category Specific Battery and Device collected real time metrics, and a computer server enabled external database accessible using either a wired or wireless bi-directional communication means, allowing either the device to communicate or "poll" a remotely located computer database storage server, or allowing either the server to communicate or "poll" the device, thereafter compare historical Category Specific Device battery metrics from the server, to the historical database to the real time battery metrics and calculating a Prognosis Battery Metric within the local device, and calculating the probability of attaining that prognosis within the Category Specific Device, displaying the resultant information on the device in human readable form. It is understood that the server database may be enabled to poll and store additional device battery metrics within the perpetual Prognostication database, during the bi-directional communication process.

The present disclosure contemplates that the Prognostication Protocol software algorithm may consist of a fixed firmware embedded comparison process between Category Specific Battery and Device collected real time metrics, and a computer server enabled external database accessible using either a wired or wireless bi-directional communication means, allowing the server to communicate or "poll" the device, extracting the real time battery metrics data from the device, comparing the real time metrics to the server hosted historical database, calculating a Prognosis Battery Metric within the server, calculating the probability of attaining that prognosis within the server, storing the recent data analysis within the perpetual Prognostication database, communicating the prognosis and probability back to the Category Specific device in human readable form.

The Prognostication Protocol software algorithm may consist of an Artificial Intelligence (A.I.) means embedded within the fixed firmware of the Category Specific Battery, or a remotely operated computer server. The A.I. means would process Category Specific Device collected real time metrics conducting a comparative analysis of the real time metrics to a historical database, self-learning the subject battery's performance characteristics, developing and testing modifications in real time to the Device's operationally applied desulfation parameters maximizing the battery's performance, determining the optimum applied process, applying that process to the battery, and recording the process and results to the historical database for future reference, The present disclosure contemplates that the battery optimization control device may also collect, process, store and transfer battery or battery cell metric data of a Category Specific battery, to other processing means, typically an external instrument, or computer based operating systems capable of individual or multiple battery or battery cell metric reading cycles.

The present disclosure contemplates that some Category Specific battery or battery cell metrics may be used independently, or in combination with other battery or battery cell metrics, or other data means, for qualitative analysis of the battery or battery cells.

The present disclosure contemplates that the use of voltage measurement metrics is more accurate and linear in response, than current measured metrics.

Communication Means

The present disclosure contemplates that the Category Specific Battery Optimization Control Device may also collect, process, store and transfer battery or battery cell metric data using a communication means to export said data to an external device, either as a standalone device, in conjunction with a battery charger, or in conjunction with an ancillary device, using a telemetry based, wireless, wired, the internet, or equivalent communications means to other processing devices such as computer based operational or analytical devices.

The Impact of Sulfation

The present disclosure contemplates that the daily or other periodic application of automated sulfation elimination processes within Category Specific batteries, may reduce or eliminate the buildup of performance reducing "daily" sulfation. That reduction of daily sulfation may reduce or eliminate the formation of "crystalline" sulfation, which therefore, may reduce or eliminate the conventional battery sulfation elimination service requirements.

The present disclosure contemplates that the reduction of daily sulfation within Category Specific batteries, may reduce or eliminate the formation of performance reducing "crystalline" sulfation, which therefore, may reduce or eliminate the conventional battery sulfation performance loss over time causing the battery to require less charge/discharge cycles to perform the same workload, when compared to non-optimized batteries, utilizing significantly more of the intended charger/discharge life cycles referred to as "Cycle Extension or Preservation".

The present disclosure contemplates that the reduction of daily sulfation within Category Specific batteries, may reduce or eliminate the formation of performance reducing "crystalline" sulfation, which therefore, may reduce or eliminate the conventional battery sulfation performance loss over time causing the battery to use less electricity per charge.

The present disclosure contemplates that the reduction of daily sulfation within Category Specific batteries, may reduce or eliminate the formation of performance reducing "crystalline" sulfation, which therefore, may reduce or eliminate the conventional battery sulfation performance loss over time, reducing or eliminating the need to perform an "Equalization Charge" to the battery. This may result in electrical savings and cycle preservation extending the battery's useful life.

Power Generation Means

The present disclosure contemplates that some Category Specific Devices may employ an AC Mains powered High Frequency—Power Factor Corrected—Multiphase Flyback, Switching Isolation Transformer Array power supply, the MFPS, such as a device previously awarded a U.S. Pat. No. 10,008,873 to the current applicants.

The present disclosure contemplates that some Category Specific Devices may employ a DC powered adaptation of the High Frequency—Power Factor Corrected—Multiphase Fly-back, Switching Isolation Transformer Array power supply, the MFPS, such as a device previously awarded a U.S. Pat. No. 10,008,873 to the current applicants. The adaptation applies a subject battery DC current source downstream of the AC Mains version of the power supply, removing the DC Rectification requirement.

The power conversion means may also be a Conventional Switching Power Supply, that converts and isolates the AC Mains power using a switching regulation means to continuously turn on and off the AC Mains, using a low-dissipation, full-on and full-off cycle methodology. The high frequency switching power supply minimizes high dissipation transitions between the full on and full off cycle, which will minimize wasted energy. Ideally, a switching power supply dissipates no power during the switching means.

The present disclosure contemplates that some Category Specific Devices may employ Magnetic Isolation Transformers and a Bridge Rectifier, commonly known within the industry, as components of the device's power generation means.

The present disclosure contemplates that some Category Specific Devices may employ a "Time Resolved Current Regulation" (TRCR) power supply means as components of the device's power generation means.

The present disclosure contemplates that some Category Specific Devices may use a "Battery Self-Generated," DC generation means, such as a DC to DC conversion System, or a Pulse Width Modulated Fly-Back Charging Mode switching means, whereas the subject battery's own DC power source is used to create and apply a Category Specific Pulse Width Modulated, variable amplitude, low frequency, high output current flow, which is then re-cycled back into the subject battery at a high peak pulse power but lower average energy. The voltage potential of the subject battery is necessarily a minimum of approximately between 10 and 50 percent of the nominal battery voltage. During the short operational duration, less energy is put back into the battery than was removed.

The present disclosure contemplates that another DC Power Supply methodology may be the Adjacent Battery Generated Means, which places another battery adjacent to the subject battery, then directly couples this battery to the Category Specific Device, substituting the external battery voltage for the that of the subject battery as was previously discussed. The adjacent battery could be chosen in a size, capacity and voltage to most closely provide the desirous capacitor voltage requirements using any of the preceding processes, which refer to the use of the subject battery as its own power source for the desulfation requirements.

The present disclosure contemplates another DC Power Supply methodology may be a Solar Power Panel Array using the power output of a Solar Power direct current panel output, when alternative power sources are unavailable. The substitution of the Solar Panel Array DC power output, which normally charges the solar battery bank at a nominal charging voltage lower than required for desulfation purposes, in conjunction with the aforementioned DC input power supply voltage amplification means to charge the storage capacitor, may act as an alternate means of powering the Category Specific Device.

The present disclosure contemplates another AC Power Supply methodology may be a Solar Power Panel Array using the power output of a Solar Power Inverter, when alternative power sources are unavailable. The substitution of the AC inverter output in conjunction with the in conjunction with the in conjunction with the aforementioned DC input power supply voltage amplification means to charge the storage capacitor, may act as an alternate means of powering the Category Specific Device.

The present disclosure contemplates another DC power supply methodology may be a Conventional Battery Charger, to utilize the power output of a Conventional Battery Charger when alternative power sources are unavailable. The substitution of the battery charger DC power output, whether connected to the subject battery, or as a free-standing charger in conjunction with the aforementioned DC input power supply voltage amplification means to charge the storage capacitor, may act as an alternate means of powering the Category Specific Device.

The present disclosure contemplates another DC power supply methodology and the Category Specific Device location may be within an automotive, forklift, vehicle, vessel, locomotive or other industrial equipment, that have an "on board" battery recharging means such as a Powerplant Powered rectified alternator, or powerplant powered DC generator, or a regenerative braking or regenerative circuitry means, or have a main power battery bank as in an electric vehicle. These Powerplant Powered sources may integrate the Category Specific Device within the powerplant, to utilize the power output of the powerplant battery charging systems, or provide a dedicated auxiliary power generation system, or utilize the electric vehicle battery bank to power the Category Specific Device. The Powerplant or Battery Bank Powered Device would be used in conjunction with the aforementioned DC input power supply voltage amplification means to charge the storage capacitor.

Various objects, features, aspects, and advantages of the present invention will become more apparent from the following detailed description of preferred embodiments of the invention, along with the accompanying drawings in which like numerals represent like components.

BRIEF DESCRIPTION OF THE DRAWING(S)

FIGS. 6.1, 6.2 and 6.3 are diagrams of a Fixed-ON State, with an Increasing Variable OFF State Pulse Width Modulated Signal.

FIGS. 7.1, 7.2 and 7.3 are diagrams of a Variable Increasing ON State, with an Increasing Variable OFF State Pulse Width Modulated Signal.

FIGS. 8.1, 8.2 and 8.3 are diagrams of a Variable Decreasing ON State, with an Increasing Variable OFF State Pulse Width Modulated Signal.

FIGS. 9.1 and 9.2 are diagrams comparing performance loss from sulfation when using the conventional battery operation compared to automatic optimization processes.

FIG. 10 is a data table of the ramp up process when starting the optimization process on a 12-volt battery using a 200 milli-amp default ramp up current and a target of 100 amps peak-to-peak at the battery.

FIG. 11 is a data table of the ramp up/ramp down process when maintaining a real time target battery peak-to-peak value. Those values change as the de-sulfation techniques are applied during battery optimization.

Figure 12:
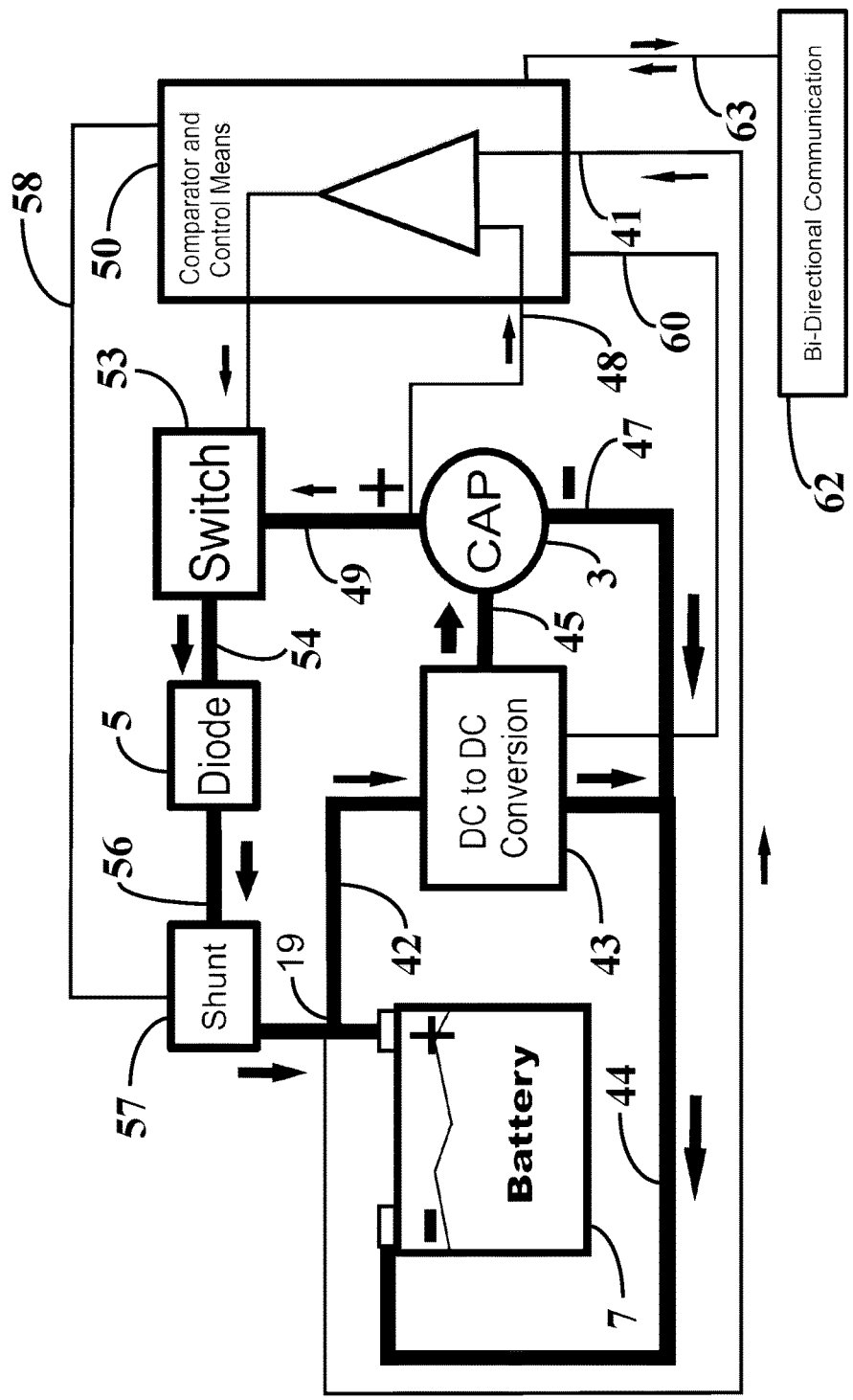

FIG. 12 is a Block Diagram of the Battery Self Powered Device.

FIGS. 13.1, 13.2 and 13.3 shows the Battery Health Indicator system and the Battery Life Remaining prognostics graphical representation.

FIGS. 14.1 and 14.2 show Block Diagrams of a comparison between battery sulfation and an Optimized Battery vs., a non-optimized battery.

DETAILED DESCRIPTION OF THE INVENTION

It will be readily understood that the components of the present invention, as generally described and illustrated in the drawings herein, could be arranged and designed in a wide variety of different configurations. Thus, the following more detailed description of the embodiments of the system and method of the present invention, as represented in the drawings, is not intended to limit the scope of the invention, but is merely representative of various embodiments of the invention. The illustrated embodiments of the invention will be best understood by reference to the drawings, wherein like parts are designated by like numerals throughout.

ITEM NUMBERS AND DESCRIPTION

1 AC power supply means
2 AC power conversion
3 storage capacitor
4 switching means B
5 diode
6 optional internal or external drive
7 battery
8 current transformer
9 control means
10 processor
11 safety system
12 sensors and transducers
13 communication means
14 DC power buss
15 DC switching means A
16 output switching means B
17 relay
18 AC power buss
21 battery—solar vehicle—generator DC power supply means
22 DC power conversion
23 AC switching means
24 rectifier
26 ground potential
31 ON state
32 OFF state
33 applied peak pulse
34 OFF state
35 applied peak pulse
36 OFF state
37 applied peak pulse
38 OFF state
39 applied peak pulse
41 conductive pathway
42 pathway
43 DC conversion system
44 return pathway ground potential
45 conductive pathway
47 return path 49 conductive pathway
50 comparator and control
53 switching means
54 conductive pathway
56 conductive pathway
57 shunt
58 conductive pathway
59 conductive pathway
60 conductive pathway
62 external bi-directional communication
63 conductive pathway
71 narrow line
72 broad line
73 voltage
74 voltage
75 voltage
76 voltage
77 voltage
78 voltage
79 voltage
80 voltage
81 voltage
82 voltage
85 voltage
86 voltage
87 voltage
88 voltage
89 upper threshold For this document, a "desulfation means" is defined as a stand-alone device to de-sulfate the battery without a charging means, or a charger that provides only what is commercially viewed as a "conventional Charging means".

In the following Category Specific Device system description there are two elements, first a Power Supply and Conductive Pathway Means to power and deliver a current flow from the device to a subject battery, and second the Pulse Width Modulation Generation and Control System (The PWM Module).

The present disclosure is directed to a battery desulfation and optimization device and process that may act in conjunction with, and control the electrical connection of, ancillary integral or external devices to the battery such as a battery charger or discharger, in a single point connection means. In this configuration, the Category Device is electrically connected to the integral or external device(s) using a discrete "inlet port connection(s)," while the battery is alternatively connected to the "single point battery port." The electrical connection between the integral or external devices are thereafter controlled by the Category Specific Device in a Battery Optimization Mode, either manually by a Human Operator, automatically by an analogue electronic processing means, or a computer-controlled process, or automatically by an Artificial Intelligence Means. The Category Specific Device may provide a switching and controlling process consisting of an individual connection or disconnection between the battery and an individual integral or external device, referred to as an individual sequence. The Category Specific Device may alternate the electrical connection between more than one individually sequenced devices and the single point connected battery, referred to as the automatic sequencing of devices, or simply as an Auto Sequence.

In a detailed embodiment, the operation of connecting the de-sulfating device to the battery may include electrically connecting conductors between the de-sulfating device and an individual cell of the battery or terminals of the battery, where the terminals are electrically connected across a plurality of cells of the battery.

The extent of sulfation of the battery before an applied process, or that an applied process has been completed, may be ascertained by measuring the real time impedance of the battery, a Battery Health Indication algorithm, a Voltage Drop Test, a Peak Voltage comparison metric, an Energy Storage means Capacitor Voltage metric, a BHI Indication Initialization Go or NO-GO test, a BHI Spectrum Analysis test, a Battery Health Indication Rate of Change Spectrum Analysis, a Battery Health Indication Frequency modulated Spectroscopy, a temperature compensated metric factor, or the real time measurement of the specific gravity of the battery cell(s), or any combination thereof; and/or the use of Category Specific empirical historical battery metric data provided by battery mounted devices, or historical battery metric data provided within databases identified and correlated to Category Specific individual batteries, or only upon the specific battery's real time performance considered a relative comparison means.

In a detailed embodiment, a de-sulfating device may include a real time peak amperage indicator providing an indication of a peak amperage provided to the battery; an average amperage indicator providing a real time indication of a root-mean-square amperage provided to the battery; and an impedance indicator providing a real time indication of an impedance of the battery, where the impedance may be determined at least in part by ascertaining a difference between the peak amperage provided to the battery and the root-mean-square amperage provided to the battery, which may be a component of a Battery Health Indicator.

In a detailed embodiment, a de-sulfating device may include a real time Peak Amperage indicator providing an indication of a peak amperage provided to the battery; and a Peak Amperage after the PWM signal has passed through the conductive pathway of the battery, which may be a component of a Battery Health Indicator.

In a detailed embodiment, a de-sulfating device may include a real time peak voltage indicator providing an indication of a peak voltage provided to the battery; and a Peak Voltage after the PWM signal has passed through the conductive pathway of the battery, which may be a component of a Battery Health Indicator.

In a detailed embodiment, a de-sulfating device may include a real time Energy Storage Means Capacitor Peak Voltage indicator providing an indication of a peak voltage required from the energy storage means to generate the desired peak pulse within the battery, which may be a component of a Battery Health Indicator.

In a detailed embodiment the Category Specific Control and Processing Electronic Circuit may contain electronic circuitry and processing capability to read raw battery/cell metric data, process battery/cell metric data, modify by raw data using a software calibration means, store data and import or export data or data commands to external instrumentation or a computer operating system.

In a detailed embodiment the Category Specific Device's external transducer elements may be capable of being used solely or in combination with other external transducers, with the provision to be positioned or aligned in many different combinations and permutations of individual battery or battery cell arrays. The differing combinations and permutations are recognized by different software calibration algorithms designed to recognize the random orientation of battery or cell arrays in combination, or software calibration algorithms designed to recognize the specific, absolute cell orientation nature of battery or cell arrays in permutation.

In a detailed embodiment the Category Specific Device's External Device transducers may provide the means to collect, process, store and transfer individual or multiple raw data metrics of a wide variety of differing types of battery or cell array physical configurations. The device allows numerous, accurate and electronically repetitive data samples to be obtained with only one labor installation action. The optimization device will provide as few as one sample, or sample quantities approaching infinity if desired, from one initial single measurement labor action.

In a detailed embodiment the Category Specific Device's External Device transducers may provide a computer processing and storage means and a software calibration and comparative means; which allows the collection of individual, multiple or comparative raw battery data metrics of an individual battery or multiple individual batteries comprising a battery array; or the collection of individual, multiple or comparative raw battery cell data metrics of an individual battery cell or multiple individual battery cells comprising a battery cell array.

The Category Specific Device provides the means to automatically apply separate and distinct software calibration schedules dependent upon the type of battery configuration sensed by the variable configurations of the device.

The Category Specific Device provides the conductive means to bi-directionally transfer electrical signals between probes and or transducers from and individual battery(s) or battery cell(s), to the measurement and processing means using either a stationary and non-flexible conductive means, a wireless transmission means. or a flexible means such as electrical wires.

Exemplary embodiments may include a control means using a native, or internal, Battery Desulfation or Optimization device including a single or plurality of capacitive discharge channels selectively activatable by a control board to provide a pulse wave modulated de-sulfating current to a lead-acid battery. Some exemplary embodiments may provide a de-sulfating current comprising an equally repeating approximate 0.75 ms ON pulse followed by a variable OFF period, which alters the applied output frequency resulting in a variable Peak Amplitude of the output signal, which may be applied to the battery at an operator determined, human operator or computer and software controlled, adjustable peak amperage of about 0-350 amps. While this "ON state" value is exemplary, the range of ON states may vary between 0 and 2 ms, whether in an "Equilibrium or Harmonic ON State Mode," while the OFF state is then determined by the resultant High Peak Amplitude requirement to desulfate the battery.

In an aspect, a method of de-sulfating a battery may include connecting a Category Specific de-sulfating device to a battery; applying electrical pulses to the battery using the de-sulfating device, where the pulses comprise a variable, or Harmonic, repeating pattern including a variable ON pulse ranging between 0.1 and 3 MS, followed by a variable OFF pulse ranging between 0.1 and 20 MS, resulting in a measured and controllable High Peak Amplitude application to the battery.

In a detailed embodiment, the device may provide a Harmonic/Oscillating de-sulfating current comprising a repeating, alternating pattern comprised of two or more pulse groupings. A "variable or harmonic" ON pulse may be varied on each successive pulse from about 0.1-01.5 ms and the variable or harmonic OFF period may be varied on each successive pulse from about 0.1-20 ms.

In a detailed embodiment, the operation of applying electrical pulses to the battery using the de-sulfating device may include applying an ON pulse having a peak amperage of about 20-30 amps. In a detailed embodiment, the operation of applying electrical pulses to the battery using the de-sulfating device may include applying an ON pulse having a peak amperage of about 40-60 amps. In a detailed embodiment, the operation of applying electrical pulses to the battery using the de-sulfating device may include applying an ON pulse having a peak amperage of about 40-130 amps. In a detailed embodiment, the operation of applying electrical pulses to the battery using the de-sulfating device may include applying an ON pulse having a peak amperage of about 130-350 amps.

In a detailed embodiment, the operation of applying electrical pulses to the battery using the de-sulfating device may include selectively, repeatedly activating a plurality of channel power pack modules electrically connected between an alternating or direct current source and the battery, and when activated, an individual channel power pack module may provide one ON pulse to the battery. In a detailed embodiment, the plurality of channel power pack modules may include a first channel power pack module and a second channel power pack module, and the operation of applying electrical pulses to the battery using the de-sulfating device may include alternately activating the first channel power pack module and the second channel power pack module.

In a detailed embodiment, the individual channel power pack module may include an Alternating Current Source connected to a fixed voltage output potential transformer with an output value of approximately 100 percent higher than the subject battery's nominal voltage, a rectifier electrically coupled to the output of the transformer power supply means "A", a capacitor electrically connected to the output of the rectifier, a switching device "B" electrically coupled to the capacitor, and a diode electrically coupled to the Switching Device B, the diode being electrically connected to the battery, and the operation of applying electrical pulses to the battery using the de-sulfating device may include alternating current supplied by the alternating current source, rectifying, using the rectifier to produce direct current; charging the capacitor using the direct current by the means of a constant voltage potential greater than the nominal battery charging voltage, and discharging the capacitor to the battery by selectively allowing conduction through the switching device A controlled by a digital software and hardware means.

In a detailed embodiment, the individual channel power pack module may include a Battery Self-Generated Means or an Adjacent Battery Generated Means direct current source connected to either a Fly-Back Conversion Module, or a DC to DC conversion Module with an output value of approximately 100 percent higher than the subject battery's nominal voltage, connected to switching means "A", a capacitor electrically connected switching means "A" to the output of either battery generated means, a switch "B" electrically coupled to the capacitor, and a diode electrically coupled to the Switching Device B, the diode being electrically connected to the battery, and the operation of applying electrical pulses to the battery using the de-sulfating device may include a direct current supplied by one of two battery generated current sources, charging the capacitor using the direct current by the means of a constant voltage potential greater than the nominal battery charging voltage, and discharging the capacitor to the battery by selectively allowing conduction through the switching device B controlled by a digital software and hardware means.

In a detailed embodiment, the individual channel power pack module may include a direct current source connected to a Solar Panel Array Generated Means with an output value of approximately 100 percent higher than the subject battery's nominal voltage, a switching means "A" of either a Fly-Back Conversion Module, or a DC to DC conversion Module electrically connected to the capacitor, a switching device "B" electrically coupled to the capacitor, and a diode electrically coupled to the Switching Device B, the diode being electrically connected to the battery, and the operation of applying electrical pulses to the battery using the de-sulfating device may include a Solar Panel Array Generated direct current; charging the capacitor using the direct current by the means of a constant voltage potential greater than the nominal battery charging voltage, and discharging the capacitor to the battery by selectively allowing conduction through the switching device B controlled by a digital software and hardware means.

In a detailed embodiment, the operation of charging the capacitor by selectively allowing conduction through switching modules A may include determining, by a digital software and hardware means using a master control board, that the switching module should allow conduction, including ascertaining that a plurality of safety conditions are satisfied and may be based at least partially upon a pulse signal received from a frequency generator; and signaling, by the digital software and hardware means master control board, the switching device A to allow conduction.

In a detailed embodiment, a Fixed Voltage AC Grid Output Power Supply, a Battery Self-Generated Power Supply, an Adjacent Battery Power Supply, or a Solar Panel Array Generated Power Supply, or a regenerative braking or regenerative circuitry means, or a Combustion Engine Generated Power Supply, or a Vehicle—Vessel—or Motive Transportation Mounted Power Supply current source may include a digital software and hardware controlled, capacitor charging switching module, enabling a fixed voltage alternating current output source or Battery Generated DC output current sources, and the method may include adjusting the on and off state of the capacitor switching device to obtain a desired peak amperage of the pulses.

In a detailed embodiment, a Fixed Voltage AC Grid Output Power Supply, a Battery Self-Generated Power Supply, an Adjacent Battery Power Supply, a Solar Panel Array Generated Power Supply or a regenerative braking or regenerative circuitry means current source may include a digital software and hardware controlled, capacitor charging switching device, enabling a variable amperage current source, and the method may include adjusting the on and off state of the capacitor switching device to obtain a desired peak voltage of the capacitor.

In an aspect, a battery de-sulfation device may include an alternating current source; output conductors configured for electrical connection to a battery; a single or plurality of channel power pack modules electrically interposing the alternating current source and the output conductors, each channel power pack module including a rectifier electrically connected to the alternating current source, a capacitor electrically connected to the rectifier, a capacitor electrically connected to an output of discharging switch "B." and a diode electrically connected to the output of the switching module; and a master control board operative to control a conduction state of each of the switching device. The master control board may be configured to control the conduction states of the switching device to provide a pulsed direct current output to the battery.

In an aspect, a battery de-sulfation device may include a direct current source; output conductors configured for electrical connection to a battery; a single or plurality of channel power pack modules electrically interposing the direct current source and the output conductors, each channel power pack module including a direct electrical connection to the direct current source, a capacitor electrically connected to an output of charging switching means "A", a capacitor electrically connected to an output of discharging switch "B", the rectifier, a charging switching device an electrically connected to the capacitor, a charging switching device B electrically connected to the capacitor, and a diode electrically connected to the output of the switching module; and a master control board operative to control a conduction state of each of the switching devices. The master control board may be configured to control the conduction states of the switching devices to provide a pulsed direct current output to the battery.

In a detailed embodiment, the alternating or direct current source may be a fixed or variable voltage or fixed or variable current alternating or a direct current source, and a voltage or amperage output from the fixed voltage alternating or direct current source may be created and adjustable by a digital software and hardware means master control board driven charging module. With respect to the all power supply modules except for a fixed voltage AC power supply output, the charging module is commanded by the master control board, allowing the capacitor current to rise, until the charging voltage reaches the targeted value. The charging module then closes containing the charge voltage within the capacitor storage means until the discharge switch closes discharging the stored current into the battery.

With respect to the fixed voltage AC power supply output, the charging module is DC rectified and directly connected the capacitor attempting to maintain capacitor nominal voltage at the same voltage potential output of the fixed voltage power supply, no capacitor charging switching means is required. Using a "Time Resolved Current Regulation" (TRCR) power supply means, the charging module then maintains the charge current within the capacitor storage means until the discharge switch closes discharging the stored current into the battery.

The present disclosure contemplates that some Category Specific Devices may employ a High Frequency—Power Factor Corrected—Multiphase Fly-back, Switching Isolation Transformer Array power supply, in either an AC Mains powered configuration, or a subject battery DC powered configuration.

The power conversion means may also be a Conventional Switching Power Supply, that converts and isolates the AC Mains power using a switching regulation means to continuously turn on and off the AC Mains, using a low—dissipation, full-on and full-off cycle methodology. The high frequency switching power supply minimizes high dissipation transitions between the full on and full off cycle, which will minimize wasted energy. Ideally, a switching power supply dissipates no power during the switching means.

The present disclosure contemplates that some Category Specific Devices may employ Magnetic Isolation Transformers and a Bridge Rectifier, as components of the device's power generation means.

A "Time Resolved Current Regulation" (TRCR) power supply means provides energy to the battery through a Pulse Width Modulated switching device. This switching device fires the energy from the capacitor into the battery. Modulating the PWM On and OFF State time duration (frequency), either increases or decreases the energy stored in the capacitor, which regulates the energy flow through the capacitor in a time-based manner. The modulation of the output frequency also increases or decreases the applied Peak Amplitude to the battery.

A deliberate "under sizing" of the TRCR configuration may result in an energy output droop provided to the energy storage means (a capacitor), which slows the rate at which the capacitor may recharge. This results in a longer time for the capacitor to charge to the target voltage and a correspondingly lower energy flow to the battery, which may be referred to as a "Time Resolved Current Regulation" power supply means.

A slowing of the fire frequency will increase the applied Peak Amplitude to the battery. Increasing the fire frequency will reduce the Peak Amplitude. Therefore, for each Category Specific battery, there is an optimum frequency firing rate and a corresponding energy limiting means provided by though the "Time Resolved Current Regulation" power supply means.

One DC Power Source methodology may use a DC to DC conversion system, that slowly draws, at a continuous rate a nominal quantity of energy, which it saves into a capacitor by charging it to a higher voltage potential, which when fired into the battery, will apply the required Peak Amplitude pulse to desulfate the battery. During the "charging of the capacitor phase" of the cycle, the subject battery is connected to the DC to DC conversion module using the single point battery cable, allowing the storage capacitor to be charged to the desired voltage potential level. Once this desired voltage potential level is attained, the connecting means between the subject battery and the DC Conversion system is interrupted, and the discharge, or fire side switching means, reverses the energy flow direction from the capacitor back into the subject battery, via the same single point battery connection cable that was used for the Charging Cycle. Although the energy is returned to the subject battery, it is returned at a much higher peak pulse power. The slowly extracted energy from the subject battery is returned to the subject battery as a very short pulse with high peak power. In this manner the energy returned to the subject battery is equal or less than the energy originally extracted from the subject battery.

Therefore, during the Capacitor Charging Cycle, the nominal energy is flowing from the battery towards the DC Conversion circuitry and accumulated into the storage capacitor. During the Capacitor Discharging Cycle, the accumulated energy stored within the capacitor is disbursed using the output switching means in a PWM regulated manner, providing a desirous Peak Amplitude of pulse power from the storage capacitor to the battery in the opposite direction as the Charging Mode means, using the same cable to the battery.

Another DC source power methodology may be to place a Pulse Width Modulated Fly-Back Charging Mode switching means between the battery and the Category Specific Device energy storage means (capacitor).

During the Capacitor Charging Cycle, a PWM switch opens and closes creating a higher than nominal, fly-back pulse whose potential causes current to flow into the capacitor. This fly-back pulse creates a higher voltage potential charge to accumulate in the capacitor, thereby raising the voltage potential of the capacitor.

During the Capacitor Discharging Cycle, the accumulated energy stored within the capacitor is disbursed using the output switching means in a regulated manner, providing a desirous Peak Amplitude of pulse power from the storage capacitor to the battery in the opposite direction, relative to the Charging Mode means, using the same conductive cable to the battery.

This process begins with a subject battery applied nominal energy packet extracted from the battery slowly over a given period of time and accumulates that energy packet in a capacitor. When the capacitor energy reaches a preset charging threshold, A discharge pulse causes that accumulated energy to be fired back into the battery, applying the required Peak Amplitude pulse to desulfate the battery. During the "charging of the capacitor phase" of the cycle, the subject battery is connected to the Pulse Width Modulated, Fly-Back switching means module using the single point battery cable, allowing the storage capacitor to be charged to the desired energy level. Once this energy level is attained, the connecting means between the subject battery and the PWM Fly-Back switching means is interrupted, and the discharge, or fire side switching means, reverses the energy flow direction from the capacitor to the subject battery, via the same single point battery connection cable that was used for the Charging Cycle.

Therefore, during the Capacitor Charging Cycle, the nominal energy is flowing from the battery towards the PWM Fly-Back switching means, accumulated onwards in the storage capacitor. During the Capacitor Discharging Cycle, the now accumulated energy stored within the capacitor is disbursed using the output switching means in a PWM regulated manner, providing a desirous Peak Amplitude of energy from the storage capacitor to the battery in the opposite direction as the Charging Mode means, using the same conductive cable to the battery.

In a dual channel detailed embodiment, the master control board may be configured to control the conduction states of the switching devices to provide a pulsed direct current output to the battery predicated upon a synchronous, repeating pattern. The applied pattern may consist of the grouping of two pulses each, the first pair considered the Primary Pulse grouping and the second pair is considered the Secondary Pulse Grouping.

In a dual channel detailed embodiment, the master control board may be configured to control the conduction states of the switching devices to provide a pulsed direct current output to the battery predicated upon an asynchronous pattern. The applied pattern may consist of the grouping of two pulses each, the first pair considered the Primary Pulse grouping and the second pair is considered the Secondary Pulse Grouping. Each individual pulse of the pair may be either symmetrical or asymmetrical with respect to each other, or a single or variable pulse frequency may be created without a "paired grouping". The paired groupings, when used, or an individual synchronous or asynchronous pattern, are pattern and amplitude limited only by the current or voltage storage capacity of the Power Supply Means.

In a single channel detailed embodiment, the master control board may be configured to control the conduction states of the switching devices to provide a pulsed direct current output to the battery including a repeating pattern including approximately 0.75 ms ON pulses interposed by a variable OFF period. While these parameters are considered exemplary, it is intended that the operational cycle may range between 0.1 to 2.0 ms ON pulses interposed by approximately 0.1 to 20 ms OFF periods.

In a detailed embodiment of a dual channel system, the master control board may be configured to control the conduction states of the switching devices associated with the first channel power pack module and the second channel power pack modules alternately such that each of the first channel power pack module and the second channel power pack module outputs a repeating pattern including an about 0.1 to 1.5 ms ON pulse followed by an about 0.1 to 20 ms OFF period and, together, the first channel power pack module and the second channel power pack module provide to the battery a repeating pattern determined by the power supply means.

In a detailed embodiment the Category Specific Control and Processing Electronic Circuit may contain electronic circuitry and processing capability to read raw battery/cell metric data, process battery/cell metric data, modify by raw data using a software calibration means, store data and import or export data or data commands to external instrumentation or a computer operating system.

The PWM Module contains the electronic circuits and software that may be designed to Scan individual battery or battery cell metrics, operate the device in a standalone desulfation mode means or in conjunction with internal or external devices, control an optional charger to battery interconnections means, control any optional internal or external device to battery interconnections, allow the operator to either manually operate the device or develop computer based Commands that automate battery restoration or optimization processes to the battery, and manually or automatically control the charger or ancillary devices that apply the developed process(s) to the battery. The PWM Module contains the internal de-sulfation means such as the single or dual channel power pack system(s), and the internal communication means such as a wired or wireless, bi directional communication means to transfer data into and out of the Category Specific Device. The PWM Module may also provide the input and output means between the operator and the external or internal devices such as a keypad, switches, LED indication lights, audio alarms, a touch screen display monitor, computer interface connections, cable connections for external devices, cable connections for the battery, cable connections for the battery charger integration, thermal and electrical circuit protection devices, and other input-output requirements.

Figure 1:
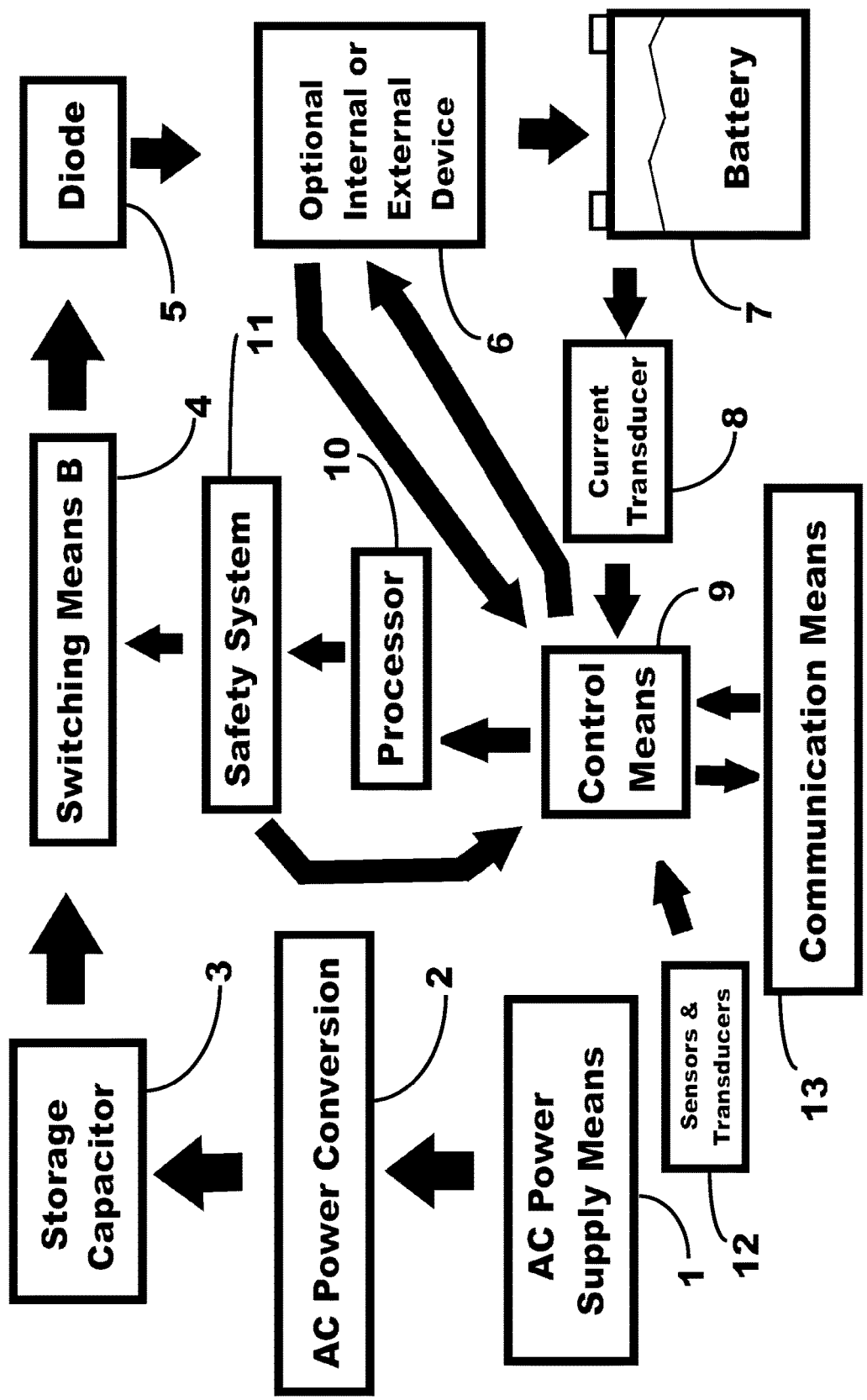
FIG. 1 is block diagram of an exemplary Category Specific Device utilizing Option 1, an Alternating Current Power Supply Means.

FIG. 1 illustrates the block diagram of the Category Specific Device system employing Option 1, the AC Conversion System, and the interconnecting devices. The AC sourced system consists of the AC Power Source Means 1, which is electrically connected to the appropriate Power Conversion Means 2 to convert AC current to a higher than subject battery nominal voltage and DC current, which is electrically connected to a DC current Storage Means 3 typically a commercially available capacitor, which is electrically connected to a PWM Modulated Output Switching Means 4, which is electrically connected to a Reverse Current Diode 5 as a protection means, which may be electrically connected to an Optional External or Internal Controllable Device 6, which is electrically connected to a subject battery 7, which is electrically connected to a commercially available Current Transducer such as a Shunt or Hall Effect Sensor.

FIG. 1 also illustrates the Scan, Command and Control Means 9 of the PWM Module which is electrically connected to and receives information from the Current Transducer 8. Control Means 9 may be electrically connected to available Sensors and Transducers 12. Control Means 9 is electrically connected to and applies positive control of Processor 10, the output of which is electrically connected to Safety System 11, the output of which is electrically connected to Switching Means 4. Safety Means 11 may interrupt the electrical connection between Processor 10 and Switching Means 4 in the event a predetermined safety related parameter or condition has been exceeded, in which Safety System 11 may provide a signal to Control Means 9. The Control Means 9 may also be controlled by an external Non-Native Charge or Operational Control means 13 or provide the means to support a bi-directional communications means 13, such as wired or wireless means to bi-directionally transmit battery data, or battery metric data, remote device command and control information, in real time via an Internet based protocol, a telemetry-based protocol, a WIFI protocol, or other data communication means.

Figure 2:
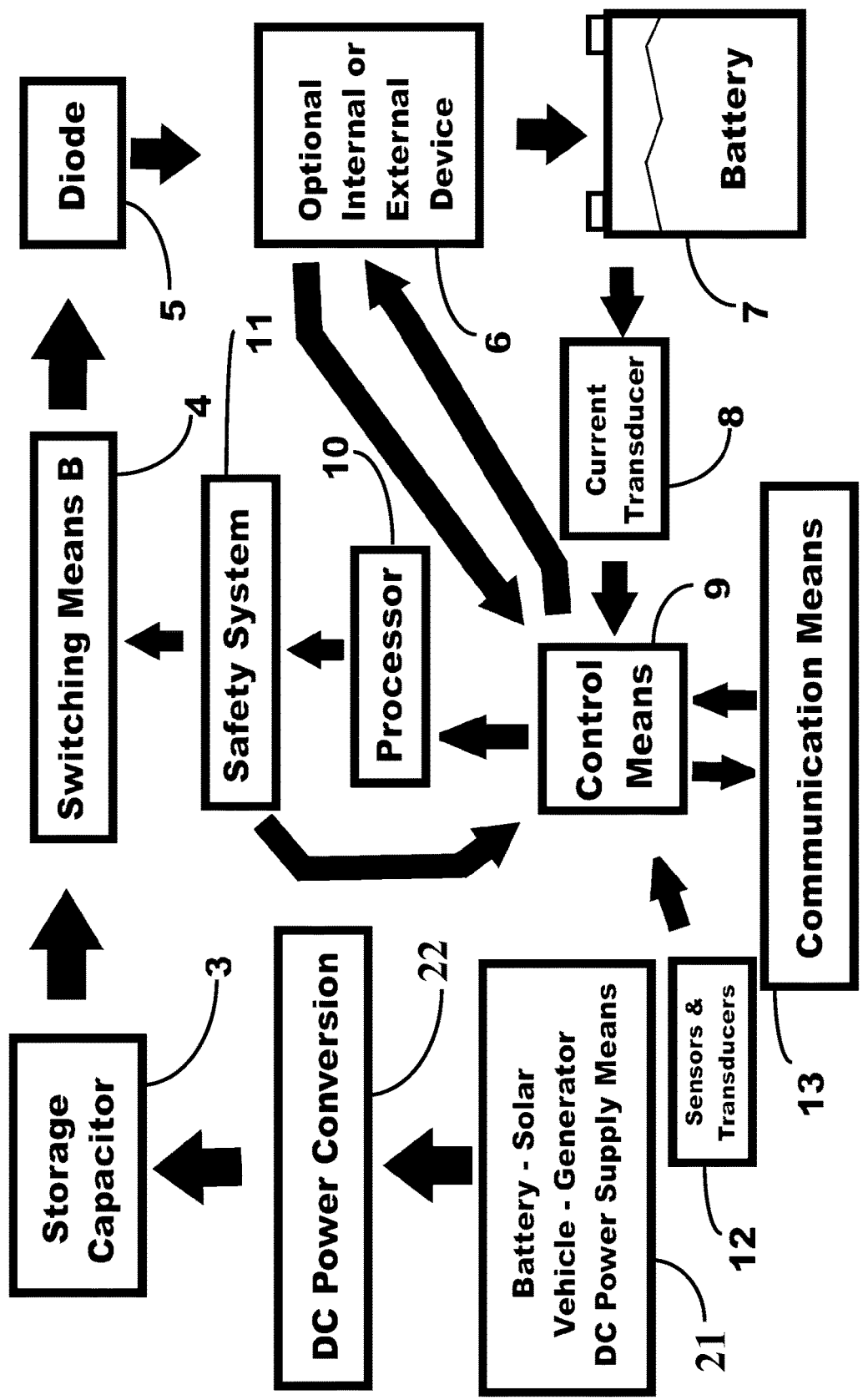
FIG. 2 is block diagram of an exemplary Category Specific Device utilizing Option 2, a Direct Current Power Supply Means.

FIG. 2 illustrates the block diagram of the Category Specific Device system employing Option 2, the DC Conversion System, and the interconnecting devices. The DC sourced system consists of the DC Power Source Means 21, which is electrically connected to the appropriate Power Conversion Means 22 to convert DC Voltage to a higher than subject battery nominal voltage and DC current, which is electrically connected to a DC current Storage Means 3 typically a commercially available capacitor, which is electrically connected to a PWM Modulated Output Switching Means 4, which is electrically connected to a Reverse Current Diode 5 as a protection means, which may be electrically connected to an Optional External or Internal Controllable Device 6, which is electrically connected to a subject battery 7, which is electrically connected to a commercially available Current Transducer such as a Shunt or Hall Effect Sensor. Switching means 4 may be controlled by Safety Means 11, which receives control signals from Processor 10, which is in turn controlled by Control Means 9.

FIG. 2 also illustrates the Scan, Command and Control Means 9 of the PWM Module which is electrically connected to and receives information from the Current Transducer 8. Control Means 9 may be electrically connected to available Sensors and Transducers 12. Control Means 9 is electrically connected to and applies positive control of Processor 10, the output of which is electrically connected to Safety System 11, the output of which is electrically connected to Switching Means 4. Safety Means 11 may interrupt the electrical connection between Processor 10 and Switching Means 4 in the event a predetermined safety related parameter or condition has been exceeded, in which Safety System 11 may provide a signal to Control Means 9. The Control Means 9 may also be controlled by an external Non-Native Charge or Operational Control means 13 or provide the means to support a bi-directional communications means 13, such as wired or wireless means to bi-directionally transmit battery data, or battery metric data, remote device command and control information, in real time via an Internet based protocol, a telemetry-based protocol, a Wi-Fi 33 protocol, or other data communication means.

Figure 3:
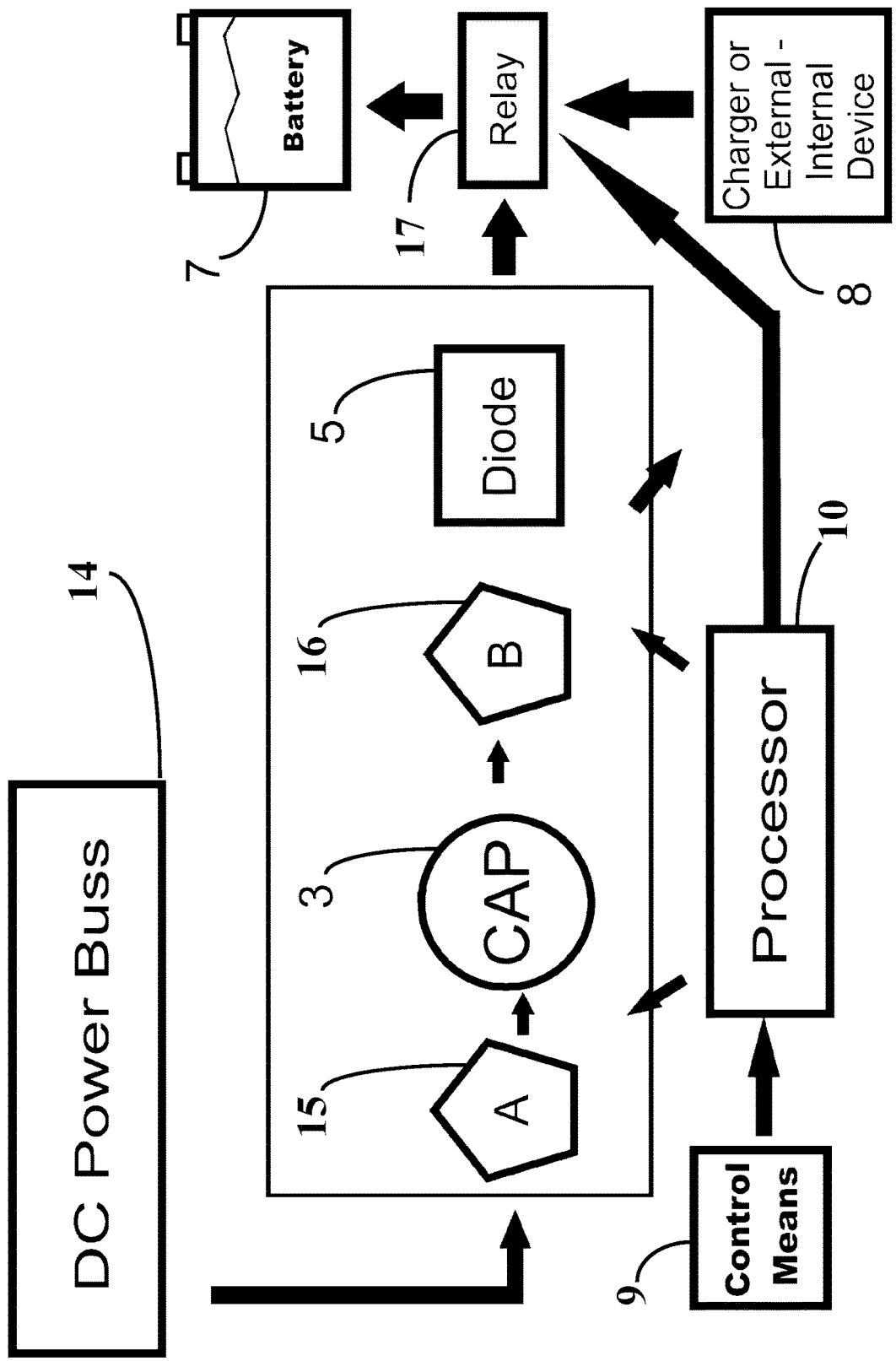
FIG. 3 is a block diagram of an AC or DC Powered Single Channel Power Pack design.

FIG. 3 shows a Fixed DC Output power supply power buss 14, connected to a DC Switching means A 15, connected to storage capacitor 3, which is connected to output switching means B item 16, which provides output current to reverse current diode 5, which allows output current flow to optional relay 17, the output of which is connected to battery 7. A Charger Interrupt Module (CIM) is optional and is controlled either manually or automatically by the control means of processor 10, which is in turn controlled by control means 9. An external or internal device 8 may also control relay 17. Control means 9 also may receive input from internal or external transducers which provide battery or environmental data metrics to processor 10.

FIG. 3 shows if the Control Means 9 provides the command to begin the optimization process, it interrupts the charger to battery connective means by opening the circuit between charger 8 and battery 7. In the absence of a command to optimize the battery, the Control Means 9 provides an un-interrupted connection means between charger 8 and the battery 7.

FIG. 3 shows that as the battery optimization de-sulfation cycle begins with the battery 7 at a measured battery voltage, the capacitor 3 at zero volts and switch 15 is open preventing the alternating current supply from ISO or HFISO power supply from charging the capacitors. Using the DC Subject battery power supply a switching means 15 charges capacitor 3. Using the "Time Resolved Current Regulation" (TRCR) power supply switch 15 does not exist, rather the constant voltage potential DC output current is connected directly to capacitor 3. When the Control Means 14 provides the battery optimization commands, and the capacitor is charged to a desired potential, switch 4 is opened discharging the capacitor into the battery. A shunt provides peak current and peak voltage battery metrics to Control Means 14.

FIG. 3 shows that with respect to the AC Power Supply selections, or the DC Fly-back or DC to DC conversion system, the Control Means 14 modulates the charging of the capacitor to create a variance in the applied peak discharge current to the battery. With respect to the "Time Resolved Current Regulation" (TRCR) power supply the DC constant voltage potential is coupled directly to the capacitor, and when the Switching Means 16 opens it discharges the full energy flow into the battery. The Control means 9 then adjust the OFF State of the output signal to increase or decrease the resultant applied peak current.

Figure 4:
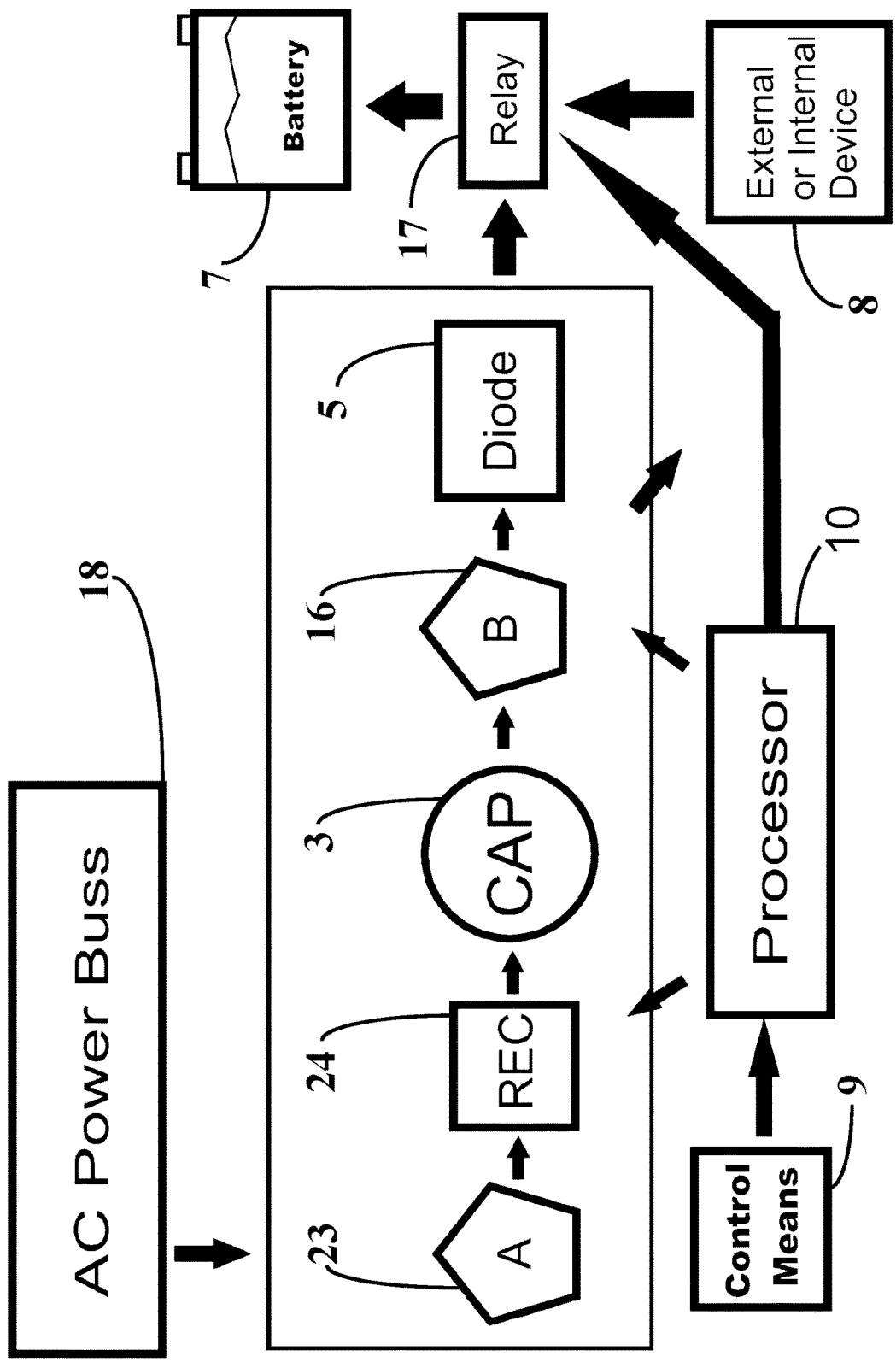
FIG. 4 is a block diagram of a Variable Output AC Power Supply Single Channel Power Pack Design.

FIG. 4 shows a Variable AC Output power supply power buss 18, connected to an AC Switching means A 23, connected to rectifier 24, which is connected to storage capacitor 3, connected to output switching means B 16, which provides output current to reverse current diode 5, which allows output current flow to optional relay 17, the output of which is connected to battery 7. Optional relay 17 is controlled either manually or automatically by the control means of processor 10, which is in turn controlled by control means 9. An external or internal device 8 may also control relay 17. Control means 9 also may receive input from internal or external transducers which provide battery or environmental data metrics to processor 10.

Figure 5:
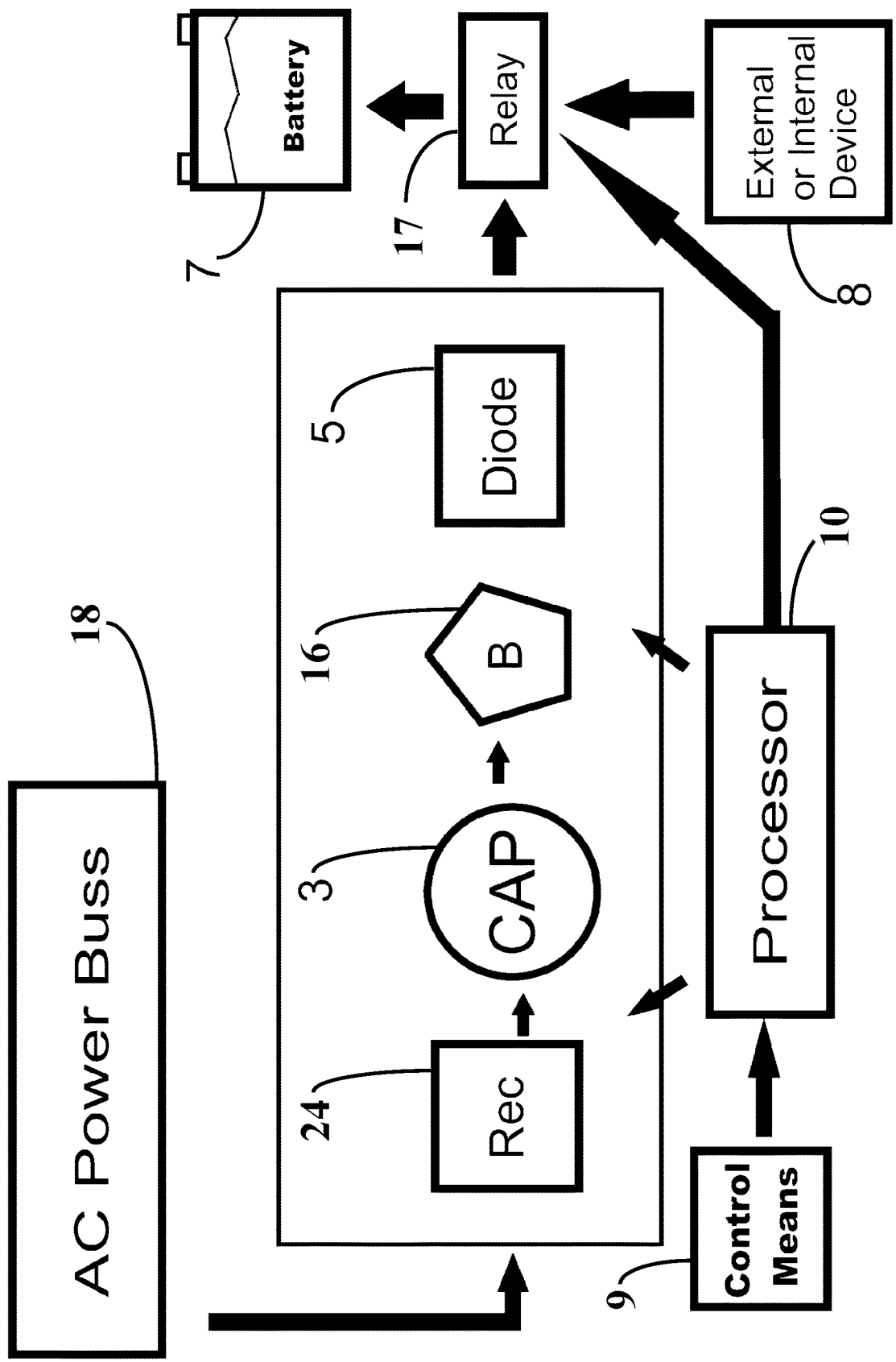
FIG. 5 is a block diagram of a Fixed Output AC Power Supply Single Channel Power Pack.

FIG. 5 shows a Fixed AC Output power supply power buss 18, connected to rectifier 24, which is connected to storage capacitor 3, connected to output switching means B item 16, which provides output current to reverse current diode 5, which allows output current flow to optional relay 17, the output of which is connected to battery 7. Optional relay 17 is controlled either manually or automatically by the control means of processor 10, which is in turn controlled by control means 9. An external or internal device 8 may also control relay 17. Control means 9 also may receive input from internal or external transducers which provide battery or environmental data metrics to processor 10.

FIG. 6.1 shows the PWM signal at an equilibrium state between the pulse ON State 31, of approximately 0.75 ms, and the pulse OFF State 32 of approximately 0.75 ms. The graph compares Current Peak Amps on the vertical axis, and Time on the horizontal axis. An exemplary device output shows that when the On State 31 is separated by a relatively short duration of OFF State 32, the resultant applied peak pulse 33 is relatively low, 25 peak amps as an example.

FIG. 6.2 shows the PWM signal with a 0.75 ms ON State, and an increasing Off State duration when compared to FIG. 6.1. An exemplary device output shows that when the On State 31 is separated by a relatively longer duration of OFF State 34, the resultant applied peak pulse 35 is relatively higher, 75 peak amps as an example.

FIG. 6.3 shows the PWM signal with a 0.75 ms ON State, and an increasing Off State duration when compared to FIG. 6.2. An exemplary device output shows that when the On State 31 is separated by a relatively longer duration of OFF State 36, the resultant applied peak pulse 37 is relatively higher, 140 peak amps as an example.

FIG. 7.1 shows the PWM signal at an equilibrium state between the pulse ON State 31, of approximately 0.75 ms, and the pulse OFF State 32 of approximately 0.75 ms. The graph compares Current Peak Amps on the vertical axis, and Time on the horizontal axis. An exemplary device output shows that when the On State 31 is separated by a relatively short duration of OFF State 32, the resultant applied peak pulse 33 is relatively low, 25 peak amps as an example.

FIG. 7.2 shows the PWM signal with an increased-ON State of approximately 0.95 ms, and an increasing Off State of approximately 1.25 ms duration when compared to FIG. 7.1. An exemplary device output shows that when the increasing On State 34 is separated by a relatively longer duration of OFF State 35, the resultant applied peak pulse 36 is relatively higher, 50 peak amps as an example.

FIG. 7.3 shows the PWM signal with an increased-ON State of approximately 1.1 ms, and an increasing Off State of approximately 1.5 ms duration when compared to FIG. 7.2. An exemplary device output shows that when the increasing On State 37 is separated by a relatively longer duration of OFF State 38, the resultant applied peak pulse 39 is relatively higher, 100 peak amps as an example. The increasing Variable ON State process with a variable OFF State, may be best used when lower peaks and a higher discharge energy duration is desirous, when compared to the peak pulse in FIG. 6.3, as an example.

FIG. 8.1 shows the PWM signal at an equilibrium state between the pulse ON State 31, of approximately 0.75 ms, and the pulse OFF State 32 of approximately 0.75 ms. The graph compares Current Peak Amps on the vertical axis, and Time on the horizontal axis. An exemplary device output shows that when the On State 1 is separated by a relatively short duration of OFF State 32, the resultant applied peak pulse 33 is relatively low, 25 peak amps as an example.

FIG. 8.2 shows the PWM signal with a decreased-ON State of approximately 0.5 ms, and an increasing Off State of approximately 1.25 ms duration when compared to FIG. 8.1. An exemplary device output shows that when the decreasing On State 34 is separated by a relatively longer duration of OFF State 5, the resultant applied peak pulse 36 is relatively higher, 75 peak amps as an example.

FIG. 8.3 shows the PWM signal with a decreased-ON State of approximately 0.25 ms, and an increasing Off State of approximately 1.5 ms duration when compared to FIG. 8.2. An exemplary device output shows that when the decreasing On State 37 is separated by a relatively longer duration of OFF State 38, the resultant applied peak pulse 39 is relatively higher, 140 peak amps as an example. The decreasing Variable ON State process with a variable OFF State, is may be best used when higher peaks and a lower discharge energy duration is desirous, when compared to the peak pulse in FIG. 6.3, as an example. A low energy discharge is beneficial when the device power source current output is limited.

FIG. 9.1 shows the Loss of Runtime of a non-optimized battery. As the impedance of the non-optimized battery (FIG. 6A) increases, there is a corresponding loss of runtime expressed in hours of use per charge. The battery begins the annual cycle with a low impedance and a 5-hour runtime, as the battery impedance increase it results in a corresponding decrease in the battery's runtime until about the 12th month, when the battery has 50% of the capacity it had in the 1st month of operation.

FIG. 9.2 shows the Loss of Runtime of an optimized battery. As the impedance of the optimized battery increases slightly, there is a corresponding slight loss of runtime expressed in hours of use per charge. The battery begins the annual cycle with low impedance and a 5-hour runtime, and since the battery is de-sulfated on a daily or other shortened periodic basis; the battery impedance increase is minimal resulting in a minimal decrease in the battery runtime in month 12.

FIG. 10 shows the data example of a Battery Health Indicator Initial Diagnostic Ramp-Up Charge to the Capacitor with a 100-amp peak-to-peak target value delivered through the battery. The data assumes that the internal battery resistance remains constant during the application of the peak amperage.

The Cycle 1 default initiating 200 milli-amp capacitor charge is applied to the battery resulting in a zero peak amps indication upon the battery.

During Cycle 2, the Control Means may then apply an additional 200 milli-amp default peak value increase to the Cycle 1 initiating value of 200 milli-amps, therefore applying 400 milli-amps to the battery, again resulting in a zero peak amps indication.

During Cycle 3, the Control Means may then apply an additional 200 milli-amp default peak value increase to the Cycle 2 value, therefore applying 600 milli-amps to the battery, again resulting in a zero peak amps indication.

During Cycle 4, the Control Means may then apply an additional 200 milli-amp default peak value increase to the Cycle 3 value, therefore applying 800 milli-amps to the battery, again resulting in a zero peak amps indication.

During Cycle 5, the Control Means may then apply an additional 200 milli-amp default peak value increase to the Cycle 4 value, therefore applying 1000 milli-amps to the battery, resulting in a 30-peak amps indication.

During Cycle 6, the Control Means may then apply an additional 200 milli-amp default peak value increase to the Cycle 5 value, therefore applying 1200 milli-amps to the battery, resulting in a 60-peak amps indication.

During Cycle 7, the Control Means may then apply an additional 200 milli-amp default peak value increase to the Cycle 6 value, therefore applying 1400 milli-amps to the battery, resulting in a 90-peak amps indication.

During Cycle 8, the Control Means may then apply an additional 200 milli-amp default peak value increase to the Cycle 7 value, therefore applying 1600 milli-amps to the battery, resulting in a 120-peak amps indication, which is beyond the targeted value of 100 amps peak.

During Cycle 9, the Control Means may then reduce the previous Cycle 8 applied 200 milli-amp default peak value increase downwards to a 100 milli-amp applied peak value to the Cycle 7 value, therefore applying 1500 milli-amps to the battery, resulting in a 110-peak amps indication, which is beyond the targeted value of 100 amps peak.

During Cycle 10, the Control Means may then reduce the previous Cycle 8 applied 100 milli-amp default peak value increase downwards to a 50 milli-amp applied peak value to the Cycle 7 value, therefore applying 1450 milli-amps to the battery, resulting in a 100-peak amps indication, which equals the targeted value of 100 amps peak.

During Cycle 11 and Cycle 12, the data table shows that the Control Means continues to sample the applied peak amps to determine the input values of the capacitor charging cycle.

FIG. 11 shows the data example of a Ram-Up or Ramp-Down Capacitor Charging Cycle, assuming a real time lowering of the battery's internal resistance, resulting from the reduction of sulfation when using the Category Specific Device system. The Control Means referred to may be an Artificial Intelligence module, an automated computer hardware and software process, or a Human Operator.

As the data table samples begin, Cycle 1 and 2 shows that when the battery has 10 milli-ohms of resistance, that the applied input current to the capacitor of 1.45 amps at 12.8 VDC, creates a 100-amp peak-to-peak pulse current within the battery.

In Cycle 3, as the internal resistance caused by sulfation diminishes to 9 milli-ohms at the same applied current level, the voltage rises to 12.9 VDC and the Peak Pulse rises to 110 amps peak-to-peak. When the Control Means senses that the peak-to-peak amplitude changes, then the software driven device will make comparative changes to the capacitor charging system to either reduce or increase the capacitor stored current. In this data example the peak amps have risen, so the Control Means will issue a Ramp Down command to the capacitor switching means, lowering the current allowed to enter the capacitor on the subsequent charging cycle.

Since the desired peak-to-peak amplitude was set at 100 amps and the actual peak amps during discharge cycle 3 were 110, then the Control Means must reduce the capacitor charging current. The Control Means will reduce the input current to the capacitor at the default step down value, in this case 200 milli-amps, and monitor the change in the peak amplitude during the net sequential cycle.

After the previous Ramp Down charge current correction, Cycle 4 shows that the voltage dropped slightly, while the peak amps decreased to 90 peak. Attempting to maintain the 100-amp peak and considering the unique nature of each (this) battery, the Control Means and operating software must calculate the subsequent cycle 5 applied Input Current to Capacitor value. The decrease of 200 milli-amps from the capacitor input current of Cycle 4 resulted in a 20-peak amp decrease, which was below the target value of 100 peak amps. The Control Means will increase the input current to the capacitor during Cycle 5 to reach the target value of 100 peak amps. If the Peak change of 20 was caused by a change of 200 milli-amps, then every 10 peak change would require a change to the capacitor input charge current of 100 milli-amps. Therefore, a change from 90 the measured peak to the target peak of 100 would require an increase in the capacitor charge current of +100 milli-amps.

The Cycle 5 capacitor input charge current is therefore 1.25 amps+100 milli-amps, or 1.35 amps. As the data table shows, once the Cycle 5 capacitor input charge current was set at 1.35 amps, the resulting battery measured peak amps was 100, which equals the target peak amps.

Cycle 6 shows that there is no sulfation induced impedance reduction from Cycle 5.

Cycle 7 shows that there is no sulfation induced impedance reduction from Cycle 5, so the capacitor input charge current remains the same.

Cycle 8 shows that there is a sulfation induced change in the battery's impedance from 9 milli-ohms to 8 milli-ohms, requiring another change in the applied capacitor input charge current.

Cycle 9 shows the reduction of the capacitor input charge current of 200 milli-amps has been applied to the battery, resulting in a change that is below the target value.

Cycle 10 has another calculated increase in the capacitor input charge current of 100 milli-amps, which results in the battery measured peak amps being equal to the target peak amps.

Cycle 11 and 12 shows that if there is no continuing change in sulfation induced resistance, then the voltage, battery peak amps remain the same may indicate the conclusion of the process.

FIG. 12 is a block diagram showing the Battery Self Powered Device operational flow of current and the control means for the process. The Battery 7 positive terminal provides a constant electrical potential using conductive pathway 42, connecting Battery 7 to a DC to DC Conversion 43 System. The DC to DC conversion 43 may be either 1) a DC to DC conversion System commonly known within the industry, 2) a Pulse Width Modulated Fly-Back Charging Mode switching means also known within the industry, or 3) DC powered adaptation of the High Frequency—Power Factor Corrected—Multiphase Fly-back, Switching Isolation Transformer Array power supply, the MFPS, such as a device previously awarded a U.S. Pat. No. 10,008,873. A return pathway ground potential 44 to the negative terminal of Battery 7 completes the DC Conversion power source circuitry.

The DC Conversion system 43 module then using conductive pathway 45 continuously charges capacitor 3 to the design maximum output of the conversion module, or as controlled by the Comparator and Control 50 Means. Capacitor 3 is connected using conductive pathway 49 to Switching Means 53, with a corresponding return pathway 47 connecting Capacitor 3 to the negative terminal of the Battery 7. Capacitor 3 normally at full design energy potential waits for Switch 53 to be opened, after which the stored energy is released into the battery. Switch 53 is controlled by Comparator and Control Means 50, which determines a) when to open the switch discharging the energy from Capacitor 3 into Battery 7, and b) the ON and OFF State frequency to release the energy into Battery 7.

In an exemplary embodiment Control Means 50 may allow the ON State to remain constant at approximately 0.75 ms, while the OFF State and the resultant output frequency may be adjusted to provide the desired Peak Amplitude current flow into the battery.

Once the modulated energy is released through Switch 53, it flows along the conductive pathway 54 to a Reverse Current Diode 5, then onwards using conductive pathway 56 towards Shunt 57, which provides a measurement means of the current and voltage peaks applied to the battery to Control Means 50 using conductive pathway 58. Current continues on towards Battery 7 using conductive pathway 59 applying the PWM desulfation signal to the positive post of the battery.

The Comparator and Control Means 50 may consist of analogue electronic circuitry, or a computer hardware and software means to measure, compare and provide an output controlling means to Switch 53. Battery Voltage V1 is measured using conductive pathway 41 from Battery 7, and Storage Capacitor 3 voltage V2 is measured using conductive pathway 48. Comparator and Control Means 50 may also control the DC to DC Module when using the DC powered adaptation of the High Frequency—Power Factor Corrected—Multiphase Fly-back, Switching Isolation Transformer Array power supply, by applying a signal along conductive pathway 60. Comparator and Control Means 50 may also receive signal inputs from the Shunt 57, using conductive pathway 58. Comparator and Control Means 50 may also bi-directionally communicate with an external bi-directional communication 62 device, using conductive pathway 63.

FIG. 13.1 is a graph of the Battery Health Indication (BHI) process GO, or NO-GO diagnostic metric. As the process is begun and device PWM output is applied to the battery, a storage capacitor voltage 73 of the storage means is required to ramp up the current flow to a target value of 100 Peak Amps, a hypothetical serviceability standard, which is measured and compared to a known serviceable Master Battery voltage 74 expectation, within the same Category Specific group of batteries. This delta comparison and the GO, NO-GO Upper Threshold 89 "20-Second Triage" diagnostic value, may be used to determine a "GO" status resulting in a continuance of the process application, or a "NO-GO" status terminating the process. The 20-Second diagnostic time factor is exemplary and not to be construed as limiting.

FIG. 13.2 is a graph of the BHI Spectrum Analysis Diagnostic metric. Once the 20-Second Triage diagnostic has successfully completed, as indicated when the initial ramp up peak voltage 73 of the subject battery was lower than the NO-GO Upper Threshold 89, the process continues as illustrated applying a frequency stabilized exemplary repeating pattern of 100 Amp Peaks, followed by a resting or OFF State. The delta value between the initial ramp up 20-second waypoint of the subject battery compared to the value of the master battery voltage 74, may be used as a predictor of the subject battery's probability of restoring to the master battery's desirous condition. The higher the voltage differential, the lower the probability of performance restoration. The lower the voltage differential, the greater the probability of performance restoration.

It is further disclosed that the delta value between the Master Battery Initialization Ramp up peak voltage 74, compared to the Subject Battery Initialization Ramp up peak voltage 73, considered an Initialization Peak Metric, may be used as a sole determination as to the Battery Health Indication valuation, as a metric in a Battery Prognostication Protocol, or in any combination thereof.

At fixed time intervals along an exemplary frequency standardized process, the Device's Control Means will measure and store the dataset points that result from the specific sample intervals. The subject battery's applied dataset points are illustrated by narrow line 71, which are then compared in real time to the Master Battery control dataset broad line 72. Furthermore, a random Peak Amp sample 5 may be compared to the Master Battery voltage 76 expectation in real time, and a BHI Comparative Delta Value may be formulated. This BHI Delta Value resulting from an applied frequency standardization process, may be used as a sole determination as to the Battery Health Indication valuation, as a metric in a Battery Prognostication Protocol, or in any combination thereof.

FIG. 13.3 is a graph of the BHI Spectroscopy Diagnostic metric, which is a frequency adjustable, temperature compensated BHI Spectrum Analysis performance profile used as a Battery Health Indicator, and various subroutines within the spectroscopy are used as predictive metric values for determining a Battery Life Remaining Prognosis.

Those subroutines may include but are not limited to a comparative process between the Subject Battery and a Master Battery consisting of, 1) a BHI Ramp Up metric, 2) a Frequency Standardized Test consisting of one or more repetitions, 3) A Higher Relative Frequency Adjusted Stress Test consisting of one or more repetitions, 4) A Lower Relative Frequency Adjusted Stress Test consisting of one or more repetitions, 5) a comparative test between any of the individual subroutines, or 6) any combination thereof, all of which are considered Absolute Testing Means.

Those subroutines may include but are not limited to a non-comparative Subject to Master battery test, disclosed as a single measurement means of the Category Specific Device's Storage Capacitor peak voltage, average voltage, or peak-to-peak voltage as a single quantitative value, or a voltage trend analysis, consisting of those measurements taken, 1) as a BHI Ramp Up metric, 2) as a Frequency Standardized Test consisting of one or more repetitions, 3) as a Higher Relative Frequency Adjusted Stress Test consisting of one or more repetitions, 4) as a Lower Relative Frequency Adjusted Stress Test consisting of one or more repetitions, 5) or any combination thereof, all of which are considered Absolute Testing Means.

It is disclosed that an Artificial Intelligence Module may perform self-generated, self-learning tests upon the subject battery in conjunction with; 1) a comparative process between the Subject Battery and a Master Battery, 2) a comparative process between a subject battery and a device stored historical database, 3) a comparative process between a subject battery and a remotely stored historical database using a bi-directional communication means, 4) Category Specific Device's Storage Capacitor peak voltage, average voltage, or peak-to-peak voltage as a single quantitative value, or a voltage trend analysis, consisting of those measurements taken, 5) as a BHI Ramp Up metric, 6) as a Frequency Standardized Test consisting of one or more repetitions, 7) as a Higher Relative Frequency Adjusted Stress Test consisting of one or more repetitions, 8) as a Lower Relative Frequency Adjusted Stress Test consisting of one or more repetitions, 9) or any combination thereof, all of which are considered a Relative Testing Means.

Once the 20-Second Triage diagnostic has successfully completed, as indicated when the ramp up peak 3 of the subject battery was lower than the NO-GO Upper Threshold 89, the process continues as illustrated applying a Frequency Standardized Test (FS Test #1) of an exemplary repeating pattern of 100 Amp Peaks, followed by a resting or OFF State. It is disclosed that the frequency may be adjusted by altering the ON-State duration, the OFF-State duration, or any combination thereof.

As illustrated in FIG. 13.3, the beginning of the Subject Battery Frequency Standardized Test #1 is Waypoint voltage 73, which ends at Waypoint voltage 75. When compared to the Master Battery Waypoints beginning at Waypoint voltage 74 and ending at Waypoint voltage 76, which may be expressed in a Delta Subject-Delta Master battery ratio analysis, mathematically expressed as (Subject Battery Waypoint voltage 73–Master Battery Waypoint voltage 74)/(Subject Battery Waypoint voltage 75–Master Battery Waypoint voltage 76), may have predictive value when contemplating a Battery Life Remaining Function. As an example, if Waypoint voltage 73 was 22 volts, and Waypoint voltage 74 was 20 volts, and Waypoint voltage 75 was 20 volts and Waypoint voltage 76 was 19.5 volts, then the mathematical expression would follow: (22−20=2)/(20−19.5=0.5)=4, which may have predictive value when contemplating a Battery Life Remaining Function. The lower the resultant value, the lower the battery's expected performance enhancement and life expectancy. The greater the value, the greater the expected performance enhancement and life expectancy.

Furthermore, when recalculating the previous value by substituting the following formulary: (Master Battery Waypoint voltage 74/Subject Battery Waypoint voltage 73)/(Master Battery Waypoint voltage 76/Subject Battery Waypoint voltage 75), may have predictive value when contemplating a Battery Life Remaining Function. As an example, if Waypoint voltage 73 was 22 volts, and Waypoint voltage 74 was 20 volts, and Waypoint voltage 75 was 20 volts and Waypoint voltage 76 was 19.5 volts, then the mathematical expression would follow: (20/22=0.90)/(19.5/20=0.95)=0.947, which may have predictive value when contemplating a Battery Life Remaining Function.

An exemplary process continues by modifying the frequency stabilized output signal to a non-stabilized higher frequency output signal, a High Frequency Stress Test as shown beginning at Waypoint voltage 75, which may be by either a variable PWM signal ON State, or a variable PWM signal OFF State, or any combination thereof, then compared to the Master Battery Waypoint voltage 76. The variability may result from the Control Means generated and controlled A.I. developed command set, or a computer hardware, processor and firmware stored command set.

As illustrated, the beginning of the Subject Battery High Frequency Stress Test is Waypoint voltage 75, which ends at Waypoint voltage 79. When compared to the Master Battery Waypoints beginning at Waypoint voltage 76 and ending at Waypoint voltage 80, which may be expressed in a Delta Subject-Delta Master battery ratio analysis, mathematically expressed as (Subject Battery Waypoint voltage 75–Master Battery Waypoint voltage 76)/(Subject Battery Waypoint voltage 79–Master Battery Waypoint voltage 80), may have predictive value when contemplating a Battery Life Remaining Function. As an example, if Waypoint voltage 75 was 26 volts, and Waypoint voltage 76 was 20 volts, and Waypoint voltage 79 was 24 volts and Waypoint voltage 80 was 19.5 volts, then the mathematical expression would follow: (26−22=4)/(22−19.5=2.5)=1.6, which may have predictive value when contemplating a Battery Life Remaining Function. The lower the resultant value, the lower the battery's expected performance enhancement and life expectancy. The greater the value, the greater the expected performance enhancement and life expectancy.

Furthermore, when recalculating the previous value by substituting the following formulary: (Master Battery Waypoint voltage 75/Subject Battery Waypoint voltage 76)/(Master Battery Waypoint voltage 79/Subject Battery Waypoint voltage 80), may have predictive value when contemplating a Battery Life Remaining Function. As an example, if Waypoint voltage 75 was 22 volts, and Waypoint voltage 76 was 20 volts, and Waypoint voltage 79 was 20 volts and Waypoint voltage 80 was 19.5 volts, then the mathematical expression would follow: (26/22=0.90)/(22/19.5=0.95)=1.044, which may have predictive value when contemplating a Battery Life Remaining Function.

A resultant comparison between Waypoint voltage 75 and voltage 79 of the subject battery and Waypoints voltage 76 and voltage 80 (considered the High Frequency Stress Test performance baseline), may be expressed in a Delta Subject/Delta Master battery ratio analysis. The resultant value may be viewed as a Battery High Frequency Performance Stress Test, which may have predictive value when contemplating a Battery Life Remaining Function.

This exemplary BHI Spectroscopy may terminate the higher frequency modification to the PWM output on the subject battery beginning at Waypoint voltage 79. The Peak Amplitude sample at Waypoint voltage 79, collected immediately after the conclusion of the stress test while the battery is in a "resting state" condition, compared to the Master Battery Waypoint voltage 80, may be a Battery Health Indication Metric, or may have a predictive value when contemplating a Battery Life Remaining Function. The greater the delta value, the lower the life remaining expectancy. The lower the delta value, the greater the life remaining expectancy.

The high frequency stress test applied final amplitude peak measured at Waypoint voltage 77 of the subject battery in comparison with the Master Battery Waypoint voltage 78, may have a predictive value when contemplating a Battery Life Remaining Function. The greater the delta value, the lower the life remaining expectancy. The lower the delta value, the greater the life remaining expectancy.

As illustrated in FIG. 13.3, the Subject Battery Frequency Standardized Test #2 is a Waypoint pathway from the Subject Battery Waypoint voltage 79 to Waypoint voltage 81, which is then compared to the corresponding waypoints of Master Battery beginning at Waypoint voltage 80 to Waypoint voltage 82, in a standardized frequency means as previously described. It is further disclosed that while all Frequency Standardized Tests may be modified and altered between differing subject batteries prior to different applied processes, it is understood that once a unique subject battery applied process has begun, all remaining Standardized Tests within the waypoint are intended to remain identical.

As illustrated in FIG. 13.3 an exemplary process continues by modifying the frequency stabilized output signal to a non-stabilized lower frequency output signal, a Low Frequency Stress Test as shown beginning at Waypoint voltage 81, which may be by either a variable PWM signal ON State, or a variable PWM signal OFF State, or any combination thereof, then compared to the Master Battery Waypoint voltage 82. The variability may result from the Control Means generated and controlled A.I. developed command set, or a computer hardware, processor and firmware stored command set.

As illustrated, the beginning of the Subject Battery Low Frequency Stress Test is Waypoint voltage 81, which ends at Waypoint voltage 85. When compared to the Master Battery Waypoints beginning at Waypoint voltage 82 and ending at Waypoint voltage 86, which may be expressed in a Delta Subject-Delta Master battery ratio analysis, mathematically expressed as (Subject Battery Waypoint voltage 85–Master Battery Waypoint voltage 82)/(Subject Battery Waypoint voltage 85–Master Battery Waypoint voltage 86), may have predictive value when contemplating a Battery Life Remaining Function. As an example, if Waypoint voltage 81 was 26 volts, and Waypoint voltage 82 was 20 volts, and Waypoint voltage 85 was 24 volts and Waypoint voltage 86 was 19.5 volts, then the mathematical expression would follow: $(26-22=4)/(22-19.5=2.5)=1.6$, which may have predictive value when contemplating a Battery Life Remaining Function. The lower the resultant value, the lower the battery's expected performance enhancement and life expectancy. The greater the value, the greater the expected performance enhancement and life expectancy.

Furthermore, when recalculating the previous value by substituting the following formulary: (Master Battery Waypoint voltage 82/Subject Battery Waypoint voltage 81)/(Master Battery Waypoint voltage 86/Subject Battery Waypoint voltage 85), may have predictive value when contemplating a Battery Life Remaining Function. As an example, if Waypoint voltage 81 was 22 volts, and Waypoint voltage 82 was 20 volts, and Waypoint voltage 85 was 20 volts and Waypoint voltage 86 was 19.5 volts, then the mathematical expression would follow: $(26/22=0.90)/(22/19.5=0.95)=1.044$, which may have predictive value when contemplating a Battery Life Remaining Function.

A resultant comparison between Waypoint voltage 81 and voltage 82 of the subject battery and Waypoints voltage 85 and voltage 86 (considered the Low Frequency Stress Test performance baseline), may be expressed in a Delta Subject/Delta Master battery ratio analysis. The resultant value may be viewed as a Battery Low Frequency Performance Stress Test, which may have predictive value when contemplating a Battery Life Remaining Function.

As illustrated in FIG. 13-3, the final exemplary subroutine, the Subject Battery Frequency Standardized Test #3, is a Waypoint pathway from the Subject Battery Waypoint voltage 85 to Waypoint voltage 87, which is then compared to the corresponding waypoints of Master Battery beginning at Waypoint voltage 86 to Waypoint voltage 88, in a standardized frequency means as previously described. It is further disclosed that while all Frequency Standardized Tests may be modified and altered between differing subject batteries prior to different applied processes, it is understood that once a unique subject battery applied process has begun, all remaining Standardized Tests within the waypoint are intended to remain identical.

For all prior descriptions in FIG. 13, the exemplary waypoint sampling intervals described herein are merely examples only, and it is within the scope of the disclosure to modify the waypoint sampling points discussed herein.

For all prior descriptions in FIG. 13, the exemplary applied process, applied subroutines and their duration may be adjusted in real time by a computer hardware and firmware embedded process, by a Human Operator using the device in a Manual Mode of Operation, by a bi-directional control means with a remote server, or by the Artificial Intelligence Module. Therefore, every battery may have a uniquely different Time to Completion, the exemplary subroutine operational intervals and the total applied process duration herein are merely examples only, and it is within the scope of the disclosure to modify those intervals and completed process duration.

For all prior descriptions in FIG. 13, the durations of the various exemplary pulses and resting periods described herein are merely examples only, and it is within the scope of the disclosure to modify the durations of any on pulses and/or off periods discussed herein.

It is also disclosed that for any of the prior descriptions in FIG. 13, the desulfation process lowers the battery's internal sulfation induced impedance.

It is also disclosed that for any of the prior descriptions in FIG. 13, the mathematical equations using the exemplary dataset may be adjusted or replaced with alternative equations.

It is also disclosed that for any of the prior descriptions in FIG. 13, the comparisons, compilations, iterations or other formularies may exist or may be discovered, that result from the exemplary process.

It is further disclosed that for any of the prior descriptions in FIG. 13, a Temperature Compensation Metric may be used within a mathematical algorithm to adjust the BHI Spectroscopy Diagnostic Analysis for a non-standard ambient, or battery electrolyte, or battery temperatures.

It is disclosed that for any of the prior descriptions in FIG. 13, while reference is made to voltage, peak voltage or peak to peak voltage as a measurement means, it is understood that those skilled in the art would understand that voltage may be substituted, or be considered in conjunction with, battery impedance as a measurement means.

For all prior descriptions in FIG. 13, it is disclosed that during a successful desulfation process, using the same applied Peak Amps with all other factors remaining constant, that the voltage spread resulting between a subject and master battery during the initial applied Waypoint comparison, or subsequent individual Waypoint comparisons, or in any combination thereof, may proportionally decrease between waypoints measured at the battery terminals, or may proportionally decrease between waypoints measured at the Storage Means Capacitor, or in any combination thereof, in a battery that is successfully being desulfated. The greater the voltage differential between the subject battery and the master battery as the process continues along the waypoints, the lower the performance enhancements from the applied desulfation process. The lessening of the voltage differential between the subject battery and the master battery as the process continues along the waypoints, the greater the performance enhancements from the applied desulfation process.

The exemplary subroutine tests such as Frequency Adjusted Testing, or Stress Testing algorithms, in any combination, duration or scope, described herein are merely examples only, and it is within the scope of the disclosure to modify the subroutines discussed herein.

FIG. 14.1 shows the measurement in milli-ohms of the accumulation of daily excess sulfation of a non-optimized battery over a representative 12-month operational period. The illustrated increase is linear over a 12-month period; however, actual measurable battery sulfate accretion rates may be non-linear with respect to time. As the sulfation induced impedance increases, the corresponding performance of the battery decreases and the battery at the 12-month interval requires a de-sulfation service to restore or re-generate the battery. Operational factors such as temperature, the re-occurring depth of discharge the battery endures, the workloads performed, and the charger types and processes are some of the factors that contribute to differing rates of sulfation.

FIG. 14.2 shows the measurement in milli-ohms of the accumulation of daily excess sulfation of an optimized battery over a representative 12-month operational period. When compared to the non-optimized battery represented by FIG. 6A, the sulfation induced impedance of the optimized battery is far less resulting in a lower loss of performance with the optimized battery remaining serviceable without the need for a de-sulfation service.

While peak-to-peak amplitude was illustrated, it is understood that the same example could be shown with the substitution of volts or time from zero as the capacitor charging current controlling means, with similar changes in the data table numerical values.

While the use of the Peak Amps battery or battery cell metric is exemplary, it is understood that other battery or cell metrics such as Peak Voltage or Impedance could be substituted for Peak Amps, or used in combination with Peak Amps, or any combination of battery or cell metrics could be used to enable the software controlled and automated "On State Charge Cycle Durations".

In some exemplary embodiments, a de-sulfating current pattern supplied to a battery may include a repeating pattern of an "On" pulse followed by a "Resting or Off" period. For example, an exemplary single channel de-sulfating current pattern supplied to a battery may include a repeating sequence of an about 0.75 millisecond (ms) on pulse followed by a variable off period. An exemplary dual channel de-sulfating current pattern supplied to a battery may include a repeating sequence of an about 0.75 millisecond (ms) on pulse followed by a variable frequency one half the value of the single channel off period. The durations of the various exemplary pulses and resting periods described herein are merely examples only, and it is within the scope of the disclosure to modify the durations of any on pulses and/or off periods discussed herein.

An Example of the Category Specific Device's Configuration within a Preferred Embodiment. (Exemplary Embodiment, not to be Considered Limiting)

In an exemplary embodiment a Category Specific Battery Optimization Device commercially known as Fleet Tune, designed for use as a motive battery optimization system within a warehousing operation, may consist of the following elements:

A single channel PWM subject battery DC self-powering device, using one of several optional power supply means, the PWM signal is a fixed-ON State, with a variable OFF State controlled by the device's control processor, or by an operator in a manual operational mode, resulting in a peak amplitude that attains a desired target value. The frequency adjusted OFF State is modulated in an increasing or decreasing manner during the process to maintain the desired peak amplitude level.

A connection means to allow an external charger to be directly connected to and be controlled by the device.

A connection means to allow a battery, or subsequent batteries to be directly connected to the device using a single point connection means.

A processor and software means that allows the connection or disconnection of the battery to the battery charger using an internal conductive pathway within the device.

The connection of the conductive pathway between the charger and the battery is connected by the device's Artificial Intelligence Means, or the device's human operator, or when the device's computer firmware determines that the battery should be charged.

The connection of the conductive pathway between the charger and the battery is interrupted by the device's Artificial Intelligence Means, or the device's human operator, or the when device's computer firmware determines that the battery should be desulfated using the single channel PWM output signal.

An initial qualitative diagnosis of the battery from a GO, or NO-GO perspective, a NO-GO result terminates the process, a GO result continues the process to the next progressive function of the processes pathway.

An additional qualitative analysis of the battery's condition by apply a Battery Health Indicator Metric Controlled, PWM output signal amplitude to the battery at a waypoint time from the GO, NO-GO diagnostic, to the first integral waypoint of the BHI Spectrum Analysis.

A resultant calculation of the Battery Health Indication Rate of Change factor, applying that factor to the A.I. Means, or as a factor in a human operator decision to continue the process, or as a factor used by the computer firmware to satisfy continued process operational parameters.

A measurement of the Storage Capacitor Peak Voltage required to attain a specified Peak Amplitude as measured at and compared with, the subject battery after the applied process, then applying that factor to the A.I. Means, or as a factor in a human operator decision to continue the process, or as a factor used by the computer firmware to satisfy continued process operational parameters.

A measurement of the BHI indication spectrum analysis dataset waypoint curve, "normalizing" that factor within the A.I. Means, or as a factor in a human operator decision to continue the process, or as a factor used by the computer firmware to satisfy continued process operational parameters.

A temperature compensated factor applied to the A.I. Means, or as a factor in a human operator decision to continue the process, or as a factor used by the computer firmware to satisfy continued process operational parameters.

A frequency adjusted BHI Indication Spectrum Analysis dataset creating a BHI Indication Modulated Spectroscopy factor within the A.I. Means, or as a factor in a human operator decision to continue the process, or as a factor used by the computer firmware to satisfy continued process operational parameters.

An A.I. generated or computer firmware normalization of the BHI spectrum analysis.

A Battery Life Remaining Prognosis displayed to the operator after completion of the process protocol.

An optional bi-directional communication means to transmit data via a wired or wireless means, to a remote computer-based server.

It is understood that this example may be exemplary, however, other combinations and permutations of the device's power supply conversion means, other combinations and permutations of the manual or automated operational means, other combinations and permutations of the diagnostics or prognostication means, or a single or plurality of power channels means may be employed.

An Example of the Process Used of the Preferred Embodiment of an Category Specific Battery Optimization System. (Exemplary Embodiment, not to be Considered Limiting)

The technician will position the Fleet-Tune device near the existing battery charger and connect the battery charger output wiring to the "Battery Charger In" connections. The technician will also connect the appropriate electrical line voltage source to the device if the device is AC powered.

During each subsequent charging cycle, the technician will plug the battery into the Device's Battery Connection and the device will automatically begin the process and diagnostically analyze the battery. The technician allows the device to automatically perform an "auto sequence" process to the battery, consisting of connecting and disconnecting the charger to the battery, and connecting and disconnecting the applied battery desulfation process to the battery.

The device will then begin the first Optimization sequential step, a diagnostic to determine a GO, or NO-GO status, if a NO-GO condition is realized the process is terminated. If a GO condition is realized, device will then automatically perform subsequent applications of a PWM output signal, modifying output frequencies in a diagnostic manner, applying various performance enhancing algorithms, conduct continuing performance diagnostics until the battery performance factors no longer show improvement, at which time the process is terminated, and the battery prognosis is determined and displayed.

The device will then conduct a second Charging sequential step, connecting the charger to the battery using the device's internal conductive pathway, allowing the charger to fully charge the battery using the charger's own native charge profile. Once the charge is complete, the device interrupts the charger to battery connection and repeats the initial Optimization sequential step.

If the A.I. Module determines that the battery performance is within an acceptable range, then the process is completed. If A.I. determines that the battery is not within acceptable parameters, it may repeat another charging and desulfation process.

Once the A.I. module, or a computer firmware algorithm, or the Human Operator determines that the battery charge and Optimization process is completed, the technician will remove the battery from the device's Battery Connection and place the battery back into service if the device a "Cycle Completed" indication or remove the battery for investigation if there is a "Fault" indication by the device of the battery's condition.

The technician will repeat this cycle for each battery that requires a re-charge.

Physical size of the illustrated version: Approximately 10 inches tall by 6 inches wide by 6 inches long.

Connector In/Out: USB or serial computer cables, AC power supply power and ground, DC power supply power and ground, battery Charger IN connection, and Battery Out connection.

The attached figures illustrate various example embodiments and components thereof, including some optional components. The figures are merely exemplary and should not be considered limiting in any way. One of skill in the art will understand that the schematically depicted illustrated embodiments may include appropriate circuitry, connectors, communications links, and the like.

While exemplary embodiments have been set forth above for the purpose of disclosure, modifications of the disclosed embodiments as well as other embodiments thereof may occur to those skilled in the art. Accordingly, it is to be understood that the disclosure is not limited to the above precise embodiments and that changes may be made without departing from the scope. Likewise, it is to be understood that it is not necessary to meet any or all of the stated advantages or objects disclosed herein to fall within the scope of the disclosure, since inherent and/or unforeseen advantages may exist even though they may not have been explicitly discussed herein.

Thus, specific embodiments of a Category Specific Device as a universal industrial battery optimization device have been disclosed. It should be apparent, however, to those skilled in the art that many more modifications besides those described are possible without departing from the inventive concepts herein. The inventive subject matter, therefore, is not to be restricted except in the spirit of the appended claims.

The invention claimed is:

1. A battery service and optimization device that desulfates a lead-acid battery by creating and applying repetitive high current, variable-low frequency, symmetrical or asymmetrical pulse width modulated signals to a subject battery, utilizing either a battery self-powered, or a regenerative braking or regenerative circuitry energy means, or conventional power supply means comprising:

a pulse width modulated signal that is a sequential repetition of individually generated and applied, single pulse generated energy cycle electronic signals, which may consist of individually variable ON state and OFF state duration, that have individually variable amplitude, or a combination of both individually variable duration and amplitude pulses;

said pulses are applied to a battery using an algorithmic sequence of the pulse width modulated signal, in a symmetrical or asymmetrical manner;

the device is configured using an alternating current power supplied device, as an internal subject battery self-powered device, or a regenerative braking or regenerative circuitry energy means, or the device is configured using a direct current power supply;

wherein said device creates the pulse width modulated signal energy by first removing lower than nominal energy potential from the battery using a primary conductive means between the battery and the device, and the device internally amplifies the battery's lower than nominal energy potential, to creating a higher than battery nominal energy capacity by using a "Ramp Up" feature within the device to incrementally increase a stored energy to a prescribed energy level that does not cause excessive overcharging of a storage means, using a computer hardware and software-controlled power amplification and storage management process so a flow of energy from the battery to the device using a primary conductive means ceases.

2. The device according to claim 1, wherein the device delivers amplified energy potential back into the battery using the same primary conductive means as was used to previously extract energy from the battery during the charging and amplification process, in consideration of the applied pulse width modulation signal.

3. The device according to claim 2, wherein the device uses an algorithm to manage and control the charging, amplification, storage and discharge process of the pulse width modulated signal energy, a storage of battery specific operational information into a computer memory database, and operate a bi-directional communications means between the device and at least one external ancillary device, or at least one internet capable device.

4. The device according to claim 1, wherein the software-controlled power amplification and storage management process controls potential excessive current inrush during an initial, single pulse connection event between the device and the battery, using a fixed or artificial intelligence algorithmic generated function that compares time, current flow and voltage rise from the battery to the storage means.

5. The device according to claim 1, wherein the software-controlled power amplification and storage management process controls an energy output potential delivered to the battery using a variable frequency response process.

6. The device according to claim 5, wherein the variable frequency process varies an applied peak current to the battery as a function of the pulse width modulation frequency of the output current flow, varying the pulse width modulation output signal to a higher frequency that reduces an output peak amplitude.

7. The device according to claim 5, wherein the ongoing sequential pulse width modulation is the software controlled power amplification and storage management process controls and limits the current flow between the battery and the device storage means, and the resultant discharge of the energy back into the battery, during each individual and variable pulse cycle using a fixed or artificial intelligence algorithmic generated function, that compares time, current flow and voltage rise from the battery to the storage means.

8. The device according to claim 5, wherein the ongoing sequential pulse width modulation is the software controlled power amplification and storage management process controls the charging of the storage means by regulating a charging voltage and current in synchronization with the storage means discharge frequency into the battery, and during each ongoing sequentially applied individual and variable pulse cycles using a fixed or artificial intelligence algorithmic generated function that compares time, current flow and voltage rise from the battery to the storage means.

9. The device according to claim 5, wherein the ongoing sequential pulse width modulation is the software controlled power amplification and storage management process considers the most previous charging and discharging event within the storage means, creates a charging algorithmic function by comparing the previous pulse generation cycle depth of discharge to the ultimate discharge voltage, then applies an additional algorithmic sequential storage means charging function for the subsequent cycles, using a fixed or artificial intelligence algorithmic generated function comparing time, current flow and voltage rise from the battery to the storage means.

10. The device according to claim 5, wherein the ongoing sequential pulse width modulation is the software-controlled power amplification and storage management process stores a charging artificial intelligence generated algorithmic function within a computer memory, as a battery category specific profile for future internal device use by an Artificial Intelligence Module, or as an exportable data set.

11. The device according to claim 10, wherein the artificial intelligence;
a) adjusts a pulse width modulation frequency;
b) adjust an On State or an OFF State of an applied pulse signal;
c) adjust an output pulse width modulation frequency and/or amplitude of the pulse width modulation frequency as a function of ambient temperature;
d) adjust the output pulse width modulation frequency and/or amplitude of the pulse width modulation as a function of the device's internal component temperature;
e) create, display and store battery life remaining and battery health indication diagnostics and prognostication;
f) bi-directionally communicate with external ancillary devices;
g) bi-directionally communicate with external database storage devices;
h) create, display and communicate battery or device conditional warnings and alarms;
i) create a battery health indication spectrum analysis to qualitatively score the battery's current performance;
j) create a battery health indication initialization GO or NO-GO analysis;
k) creates a battery health indication frequency modulated spectroscopy that predicts battery life remaining;
l) create a battery health indication rate of change metric that may be used in battery life remaining prognostication;
m) creates a frequency adjusted pulse width modulated high current signal which provides a battery health indication spectroscopy metric used to predict the battery life remaining of a subject battery, when compared to a master battery;
n) create a "Normalization" of the battery health indicator spectrum analysis dataset curve when that "normalization" consists of a mathematical battery health indication rate of change spectrum analysis factor, or a mathematical battery health indication frequency modulated Spectroscopy factor, or a mathematical battery initial GO, NO-GO analysis factor, or a capacitor state of charge metric factor, or a mathematical temperature compensated metric factor, or any combination thereof, therefore not relying upon a master database comparison considered an absolute means of dataset comparison, on the specific battery's real time performance considered a relative comparison means, and o) creates an externally hosted artificial intelligence means located on a remotely operated and located computer.

12. The device according to claim 5, wherein the ongoing sequential pulse width modulation is the software-controlled power amplification and storage management process utilizes previously stored charging profile(s) that are stored within a computer memory, or as provided by a bi-directionally enabled communications database, then directly uses, or modifies those profiles in real time within an artificial intelligence module.

13. The device according to claim 12, wherein the Artificial Intelligence Module uses a "Self-Learning Means" to modify the pulse width modulation configuration in reaction to a measured effect of the most previous pulse width modulation signal, or a weighted average of pulse width modulation signals, on the battery in comparison of real-time battery metric measurements to a prescribed desirous affect.

14. The device according to claim 13, wherein the comparison of real time battery metric measurements during the device's applied process to a battery specific database of expected battery characteristics is located within an embedded memory, or located external to the device located in a bi-directional communication accessible remote database.

15. The device according to claim 13, wherein a trend analysis of the real time battery metric measurements applied processes affect upon a battery is used as a diagnostic and prognostication means to qualitatively score the battery's expected performance, health indication diagnostics and life remaining expectancy.

16. The device according to claim 1, wherein the device uses a time resolved current regulation power supply to the battery through the pulse width modulated to modulating the variable ON state and OFF state duration to increase or decrease an energy in a storage means to regulate energy that flows through the storage means in a time-based manner.

17. The device according to claim 1, wherein the device is powered by the subject battery to enable a bi-directional communication means via an internet connection, to an Internet based device, or to a local area network, or wired or wireless communication means.

18. The device according to claim 1, further collects, processes, stores and transfers at least one raw data metric for different types of batteries or cell array physical configurations, using external transducers or devices.

* * * * *